United States Patent
Yamaguchi et al.

(10) Patent No.: US 8,659,920 B2
(45) Date of Patent: Feb. 25, 2014

(54) SWITCHING DEVICE PROVIDED WITH A FLOWING RESTRICTION ELEMENT

(75) Inventors: Nobuhisa Yamaguchi, Toyokawa (JP); Yasuyuki Sakai, Obu (JP)

(73) Assignee: DENSO CORPORATION, Kariya (JP)

( * ) Notice: Subject to any disclaimer, the term of this patent is extended or adjusted under 35 U.S.C. 154(b) by 151 days.

(21) Appl. No.: 13/314,499

(22) Filed: Dec. 8, 2011

(65) Prior Publication Data
US 2012/0147641 A1 Jun. 14, 2012

(30) Foreign Application Priority Data
Dec. 14, 2010 (JP) ................................. 2010-278340

(51) Int. Cl.
*H02H 7/122* (2006.01)

(52) U.S. Cl.
USPC .................. 363/56.02; 363/56.03; 363/56.05

(58) Field of Classification Search
USPC .......................... 363/56.02, 56.03, 56.05, 132
See application file for complete search history.

(56) References Cited

U.S. PATENT DOCUMENTS

| | | | |
|---|---|---|---|
| 5,172,310 A * | 12/1992 | Deam et al. .................... | 363/144 |
| 5,550,730 A * | 8/1996 | Seki .............................. | 363/132 |
| 5,710,699 A * | 1/1998 | King et al. ..................... | 363/132 |
| 5,801,936 A * | 9/1998 | Mori et al. ..................... | 363/132 |
| 5,910,892 A * | 6/1999 | Lyons et al. ................... | 363/98 |
| 5,953,222 A * | 9/1999 | Mizutani ..................... | 363/56.05 |
| 2010/0327348 A1* | 12/2010 | Hashimoto et al. ........... | 257/337 |

FOREIGN PATENT DOCUMENTS

| JP | 6-335249 | 12/1994 |
|---|---|---|
| JP | H7-7924 | 1/1995 |
| JP | 9-135155 | 5/1997 |
| JP | H10-42573 | 2/1998 |
| JP | P2003-032091 A | 1/2003 |
| JP | 3566505 | 6/2004 |
| JP | 4380070 | 10/2009 |

OTHER PUBLICATIONS

Japanese Official Action dated Nov. 13, 2012 issued in corresponding Japanese Application No. 2010-278340, with English translation.
U.S. Appl. No. 13/287,246, of Yamaguchi et al, filed Nov. 2, 2011.
U.S. Appl. No. 13/014,004, filed Jan. 26, 2011, Yamaguchi.

* cited by examiner

*Primary Examiner* — Adolf Berhane
*Assistant Examiner* — Emily P Pham
(74) *Attorney, Agent, or Firm* — Nixon & Vanderhye PC

(57) ABSTRACT

A switching device includes a flowing restriction element, a conductor and a snubber resistor. The flowing restriction element has an opening and closing function to open and close a flowing path of an electric current. The conductor is connected to the flowing restriction element. The snubber resistor is connected to the flowing restriction element and constitutes a snubber circuit. The snubber resistor is disposed along the conductor.

24 Claims, 18 Drawing Sheets

SWITCHING DEVICE PROVIDED WITH A FLOWING RESTRICTION ELEMENT

CROSS REFERENCE TO RELATED APPLICATION

This application is based on Japanese Patent Application No. 2010-278340 filed on Dec. 14, 2010, the disclosure of which is incorporated herein by reference.

FIELD OF THE INVENTION

The present invention relates to a switching device provided with a flowing restriction element that has a function of opening and closing a flowing path of an electric current.

BACKGROUND OF THE INVENTION

For example, JP09-135155A describes a semiconductor device that has a switching element constituting a three-phase inverter as a main circuit and a snubber circuit connected to the switching element as a sub circuit. A diode and a resistor of the snubber circuit are mounted on a sub circuit board, and a main circuit board is arranged adjacent to the sub circuit board so as to restrict an increase in temperature of the main circuit board.

However, in a case where the snubber circuit and the main circuit are mounted on separate circuit boards, a parasitic inductance of the snubber circuit is likely to increase. On the other hand, if the snubber circuit is disposed adjacent to the main circuit as much as possible so as to reduce the parasitic inductance, although the size of the snubber circuit can be reduced, it is necessary to consider heat generation from the resistor of the snubber circuit.

SUMMARY OF THE INVENTION

According to an aspect, a switching device includes a flowing restriction element, a conductor and a snubber resistor. The flowing restriction element has an opening and closing function to open and close a flowing path of an electric current. The conductor is connected to the flowing restriction element. The snubber resistor is connected to the flowing restriction element and constitutes a snubber circuit. The snubber resistor is disposed along the conductor.

In such a configuration, since the snubber resistor is disposed along the conductor connected to the flowing restriction element, heat generated from the snubber resistor is dissipated through the conductor.

According to a second aspect, a switching device includes a series connection unit, a first conductor, a second conductor and a snubber circuit. The series connection unit includes a first flowing restriction element that has a rectifying function to permit an electric current in one direction, and a second flowing restriction element that has at least one of an opening and closing function to open and close a flowing path of an electric current and a rectifying function to permit an electric current in one direction. The first flowing restriction element and the second flowing restriction element are connected in series. The first conductor is connected to the first flowing restriction element. The second conductor is connected to the second flowing restriction element. The snubber circuit includes a snubber resistor, and is connected in parallel to the series connection unit. The snubber resistor is disposed along the second conductor.

In such a configuration, since the snubber resistor is disposed along the conductor connected to the second flowing restriction element, heat generated from the snubber resistor is dissipated through the conductor.

BRIEF DESCRIPTION OF THE DRAWINGS

Other objects, features and advantages of the present invention will become more apparent from the following detailed description made with reference to the accompanying drawings, in which like parts are designated by like reference symbols and in which.

DETAILED DESCRIPTION OF EXEMPLARY EMBODIMENTS

<First Embodiment>

A first embodiment will be described with reference to FIGS. 1 through 4. In the first embodiment, a switching device is exemplarily employed to a switching device of an inverter connected to a rotary machine, which is one of main components of a vehicle.

Figure 1:
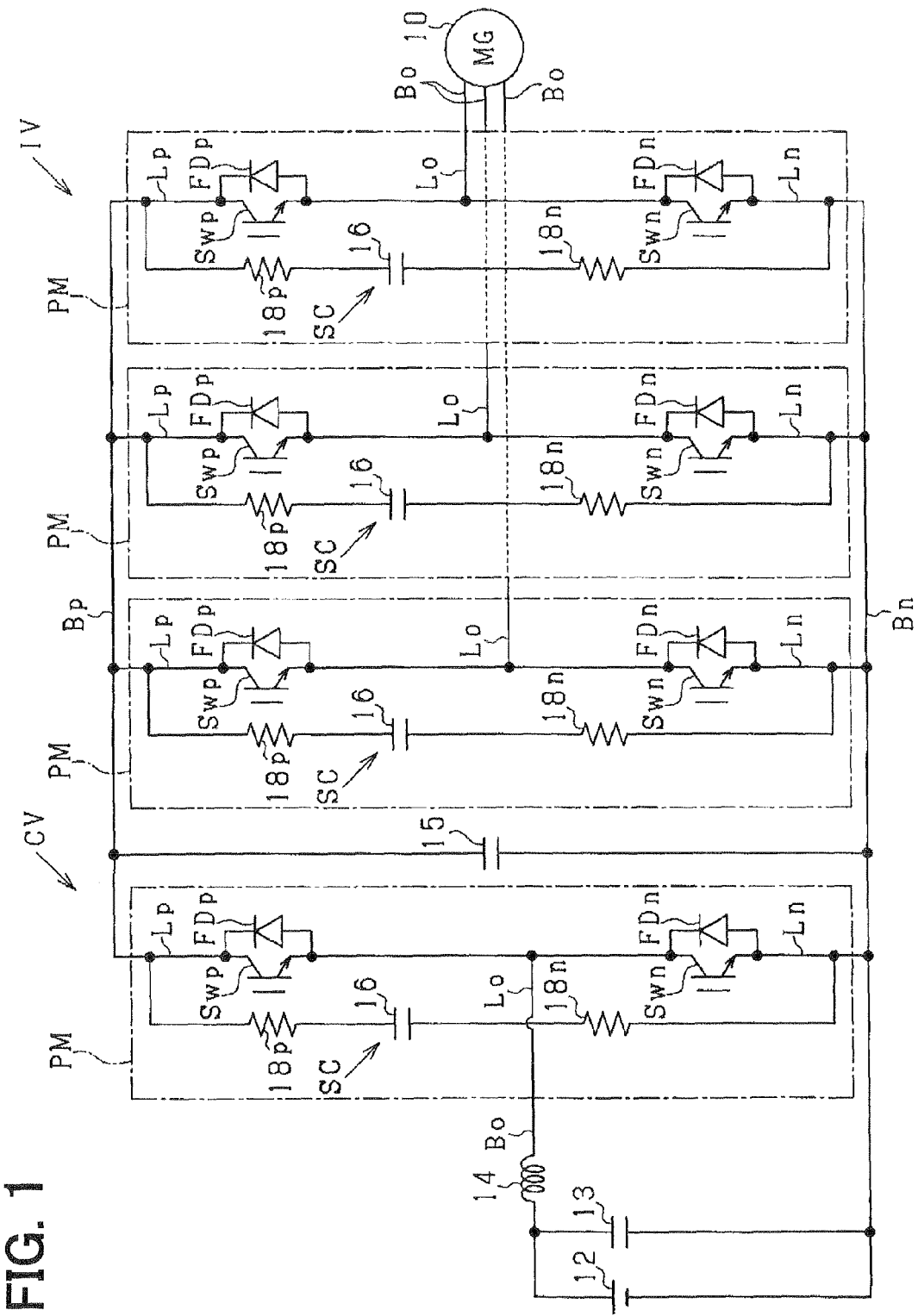
FIG. 1 is a circuit diagram of a switching device according to a first embodiment.

FIG. 1 is a schematic circuit diagram illustrating an entire structure of a control system according to the present embodiment. A motor generator 10 is a main component of a vehicle, and is mechanically connected to a drive wheel (not shown). The motor generator 10 is electrically connected to a smoothing capacitor 13 and a high-voltage battery 12 through an inverter IV and a boost converter CV.

The boost converter CV includes a capacitor 15, a pair of switching elements Swp, Swn, and a reactor 14. The switching elements Swp, Swn are connected in parallel with the capacitor 15. The reactor 14 connects a positive side of the high-voltage battery 12 and a connecting point between the switching element Swp and the switching element Swn.

The high-voltage battery 12 has a terminal voltage that has a high-voltage such as over a hundred volts (e.g., 288V). The boost converter CV boosts the voltage of the high-voltage battery 12 to a predetermined voltage (e.g., 650V).

The inverter IV has three series connection units each including the switching elements Swp, Swn connected in series. The connecting points between the switching elements Swp, Swn in the series connection units are connected to a U-phase, a V-phase and a W-phase of the motor generator 10, respectively.

In the present embodiment, each of the switching elements Swp, Swn is provided by an insulated gate bipolar transistor (IGBT). A free wheel diode FDp is connected to the switching element Swp in anti-parallel. A free wheel diode FDn is connected to the switching element Swn in anti-parallel.

A snubber circuit SC is connected in parallel with the series connection unit including the switching element Swp on a high-potential side and the switching element Swn on a low-potential side. The snubber circuit SC forms a series connection unit including a snubber resistor 18p, a capacitor 16 and a snubber resistor 18n. The series connection unit including the switching element Swp and the switching element Swn and the snubber circuit SC constitute a power module PM.

With regard to the power module PM, a high-potential side wiring Lp is connected to the high-potential side switching element Swp. Further, the wiring LP is connected to a high-potential side input terminal of the inverter IV through a high-potential side bus bar Bp. A low-potential side wiring Ln is connected to the low-potential side switching element Swn. Further, the wiring Ln is connected to a low-potential side input terminal of the inverter IV through a low-potential side bus bar Bn.

With regard to the power module PM of the inverter IV, an intermediate wiring Lo is connected to a connecting point between the high-potential side switching element Swp and the low-potential side switching element Swn. Further, the intermediate wiring Lo is connected to a bus bar Bo that is connected to the corresponding phase of the motor generator 10.

With regard to the power module PM of the boost converter CV, an intermediate wiring Lo is connected to a connecting point between the high-potential side switching element Swp and the low-potential side switching element Swn. Further, the intermediate wiring Lo is connected to a bus bar Bo that is connected to the reactor 14.

The above described snubber circuit SC is provided to connect an electric path where the current value varies in accordance with a switching state of the switching elements Swp, Swn in a short-loop manner. The function of the snubber circuit SC is described with regard to a case where the switching state is changed from a first switching state where the switching element Swp of the inverter IV is in an on state and the switching element Swn of the inverter IV is in an off state to a second switching state where the switching element Swp of the inverter IV is in an off state and the switching element Swn of the inverter IV is in an on state, as an example.

In the example, if the snubber circuit SC is not provided, the electric current in the high-potential side bus bar Bp is reduced and the electric current in the low-potential side bus bar Bn is increased. However, the voltage is generated to interrupt the change in the electric current due to the parasitic inductances of the bus bars Bp, Bn.

On the other hand, if the snubber circuit SC is provided, the electric current flowing through the high-potential side bus bar Bp flows into a positive terminal of the capacitor 16 in accordance with the change in the switching state, and the electric current flowing out from a negative terminal of the capacitor 16 flows into the free wheel diode FDn.

Therefore, the sudden change in the electric current of the bus bars Bp, Bn is reduced, and hence the voltage caused by the parasitic inductances of the bus bars Bp, Bn can be reduced.

It is to be noted that even if the snubber circuit SC is provided, the electric current in the loop circuit provided by the series connection unit including the high-potential side switching element Swp and the low-potential side switching element Swn and the snubber circuit SC changes with the change in the switching state. Therefore, the surge and the radiation noise are likely to occur due to the parasitic inductance in the loop circuit and the change in the electric current.

In the present embodiment, the loop circuit including the series connection unit and the snubber circuit SC is integrally formed using a printed circuit board (multilayer board) so as to sufficiently reduce the loop circuit in size.

Figure 2:
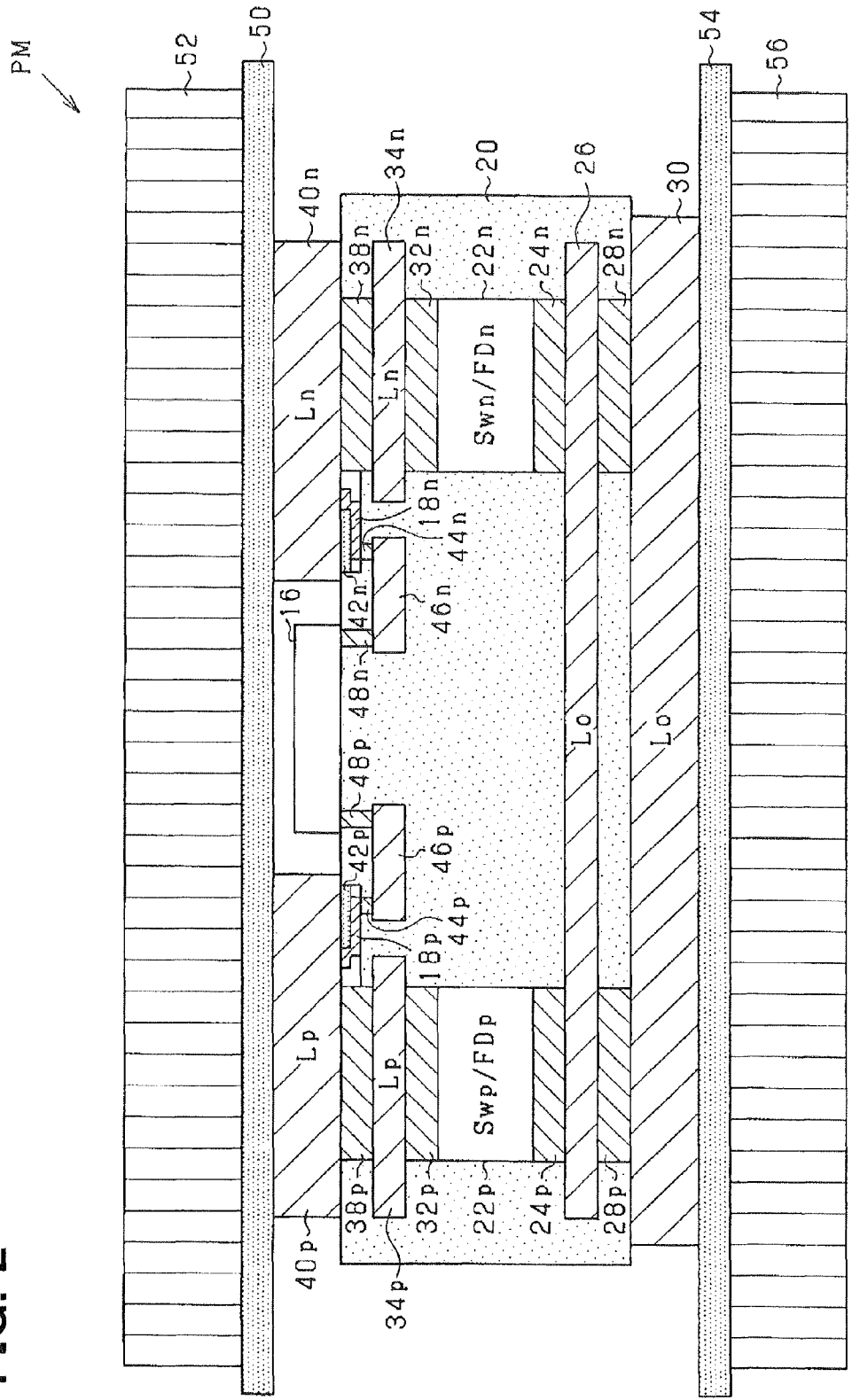
FIG. 2 is a cross-sectional view of a power module of the switching device according to the first embodiment.

FIG. 2 is a cross-sectional view of the power module PM according to the present embodiment.

As shown in FIG. 2, the switching element Swp and the switching element Swn are embedded in the same layer of a multilayer board 20. Specifically, a semiconductor chip 22p and a semiconductor chip 22n are arranged in the layer and insulated from each other. The switching element Swp and the switching element Swn are vertical devices, respectively. An emitter and an opening and closing control terminal (gate) of the switching element Swp are formed on a first surface of the semiconductor chip 22p, and a collector of the switching element Swp is formed on a second surface of the semiconductor chip 22p, the second surface being opposite to the first surface. An emitter and an opening and closing control terminal (gate) of the switching element Swn are formed on a first surface of the semiconductor chip 22n, and a collector of the switching element Swn is formed on a second surface of the semiconductor chip 22n, the second surface being opposite to the first surface. Further, the semiconductor chips 22p, 22n are arranged in a reversed manner. That is, the arrangement of the first surface and the second surface is opposite between the semiconductor chip 22p and the semiconductor chip 22n.

The free wheel diode FDp is formed in the semiconductor chip 22p. The free wheel diode FDn is formed in the semiconductor chip 22n. In the example of FIG. 2, the switching element Swp and the free wheel diode FDp are illustrated in the same semiconductor chip 22p. Likewise, the switching element Swn and the free wheel diode FDn are illustrated in the same semiconductor chip 22n. However, such an illustration does not necessarily mean that the switching element Swp, Swn and the free wheel diode FDp, FDn are formed in the same semiconductor chip. The switching element Swp, Swn and the free wheel diode FDp, FDn are illustrated in the same semiconductor chip for an illustration purpose.

The first surface of the semiconductor chip 22p on which the emitter and the anode are formed is connected to a wiring layer 26 through a via conductor 24p. The second surface of the semiconductor chip 22n on which the collector and the cathode are formed is connected to the wiring layer 26 through the via conductor 24n. The wiring layer 26 provides the intermediate wiring Lo. The wiring layer 26 is formed in such a manner that the portion connecting to the gate and the like of the semiconductor chip 22p and the portion connecting to the emitter of the semiconductor chip 22p are insulated from each other.

The conductor 30 is formed on a surface of the multilayer board 20. The portion of the wiring layer 26 connected to the emitter and the anode of the semiconductor chip 22p and the portion connected to the semiconductor chip 22n are connected to the conductor 30 through via conductors 28p, 28n.

The conductor 30 is made of copper or the like. The conductor 30 provides the intermediate wiring Lo. In addition, the conductor 30 serves as a heat spreader for radiating heat generated from the semiconductor chips 22p, 22n. To serve as the heat spreader, the conductor 30 has a surface area larger than a surface area of the semiconductor chips 22p, 22n and a sufficient height.

The heat of the conductor 30 is emitted to a heat radiator 56 through an insulating film 54. The insulating film 54 is made of a material having a high heat conductivity. For example, the insulating film 54 is made of ceramics, an insulating film member or the like.

The second surface of the semiconductor chip 22p on which the collector and the cathode are formed is connected to a wiring layer 34p through a via conductor 32p. The wiring layer 34p provides the high-potential side wiring Lp. The first surface of the semiconductor chip 22n on which the emitter, the gate and the anode are formed is connected to a wiring layer 34n through a via conductor 32n. The wiring layer 34n forms the low-potential side wiring Ln.

The wiring layer 34p and the wiring layer 34n form the same layer (wiring layer). With regard to the wiring layer 34n, the portion connected to the emitter and the anode and the portion connected to the gate are insulated from each other.

The portion of the wiring layer 34n to which the emitter and the anode of the semiconductor chip 22n are connected provides the low-potential side wiring Ln. The wiring layer 34p provides the high-potential side wiring Lp.

The wiring layer 34p is connected to a conductor 40p through a via conductor 38p. The portion of the wiring layer 34n to which the emitter and the anode of the semiconductor chip 22n are connected is connected to a conductor 40n through a via conductor 38n.

The conductors 40p, 40n are made of copper, for example. The conductor 40p provides the high-potential side wiring Lp. In addition, the conductor 40p serves as a heat spreader for radiating heat generated from the semiconductor chip 22p. Likewise, the conductor 40n provides the low-potential side wiring Ln. In addition, the conductor 40n serves as a heat spreader for radiating heat generated from the semiconductor chip 22n.

To serve as the heat spreader, the conductor 40p has a surface area larger than that of the semiconductor chip 22p and a sufficient height. Likewise, the conductor 40n has a surface area larger than that of the semiconductor chip 22n and a sufficient height.

The heat of the conductor 40p, 40n is emitted to a heat radiator 52 through an insulating film 50. For example, the insulating film 50 and the heat radiator 52 are made of the similar materials to those of the insulating film 54 and the heat radiator 56, respectively.

The conductor 40p is connected to the snubber resistor 18p. The snubber resistor 18p has a thin film shape. Most part of the snubber resistor 18p is disposed along the conductor 40p through the insulating film 42p. The remaining part (small part) of the snubber resistor 18p is connected to the conductor 40p, so a cross-section of the film forming the snubber resistor 18p corresponds to a cross-section of a current path.

The conductor 40n is connected to the snubber resistor 18n. The snubber resistor 18n has a thin film shape. Most part of the snubber resistor 18n is disposed along the conductor 40n through the insulating film 42n. The remaining part (small part) of the snubber resistor 18n is connected to the conductor 40n, so a cross-section of the film forming the snubber resistor 18n corresponds to a cross-section of a current path.

The snubber resistors 18p, 18n have an equal length (except for a manufacturing error) with respect to a direction in which a distance between the conductor 40p and the conductor 40n or between the wiring layer 34p and the wiring layer 34n is measured, that is, an alignment direction where the conductor 40p and the conductor 40n are aligned across a space. For example, the alignment direction corresponds to a left and right direction in FIG. 2. Also, the conductors 40p, 40n have an equal length (except for a manufacturing error) with respect to the alignment direction.

The snubber resistors 18p, 18n are made of a metal oxide such as ruthenium oxide or carbon, nichrome, copper nickel, or a complex of these materials, for example. The insulating films 42p, 42n are made of ceramics, alumina, aluminum nitride, spinel or the like, for example.

The snubber resistor 18p is connected to a wiring layer 46p through a via conductor 44p. The wiring layer 46p is at the same layer as the wiring layer 34p. The snubber resistor 18n is connected to a wiring layer 46n through a via conductor 44n. The wiring layer 46n is at the same layer as the wiring layer 34n.

The wiring layer 46p is connected to a terminal of the capacitor 16 through a via conductor 48p. The wiring layer 46n is connected to an opposite terminal of the capacitor 16 through the via conductor 48n. The capacitor 16 is disposed on a surface of the multilayer board 20. The capacitor 16 has a height equal to or smaller than the height of the conductors 40p, 40n.

Figure 3:
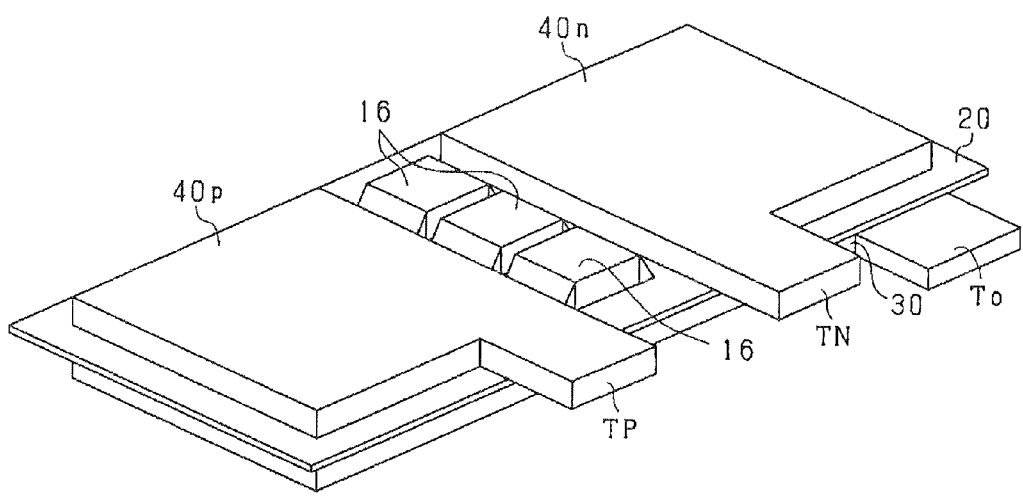
FIG. 3 is a perspective view of the power module according to the first embodiment.

FIG. 3 is a perspective view of the power module PM from which the insulating films 50, 54 and the heat radiators 52, 56 are removed. As shown in FIG. 3, the power module PM has a high-potential side terminal TP connecting to the high-potential side bus bar BP, a low-potential side terminal TN connecting to the low-potential side bus bar Bn, and a terminal TO connecting to the bus bar Bo.

The terminals TP, TN, TO are provided by portions of the conductors 40p, 40n, 30, projecting from the multilayer board 20, respectively. In the present embodiment, the capacitor 16 is provided by a parallel connection unit including multiple capacitors (e.g., three). The multiple capacitors are aligned in a direction perpendicular to the alignment direction of the conductors 40p, 40n.

Figure 4:
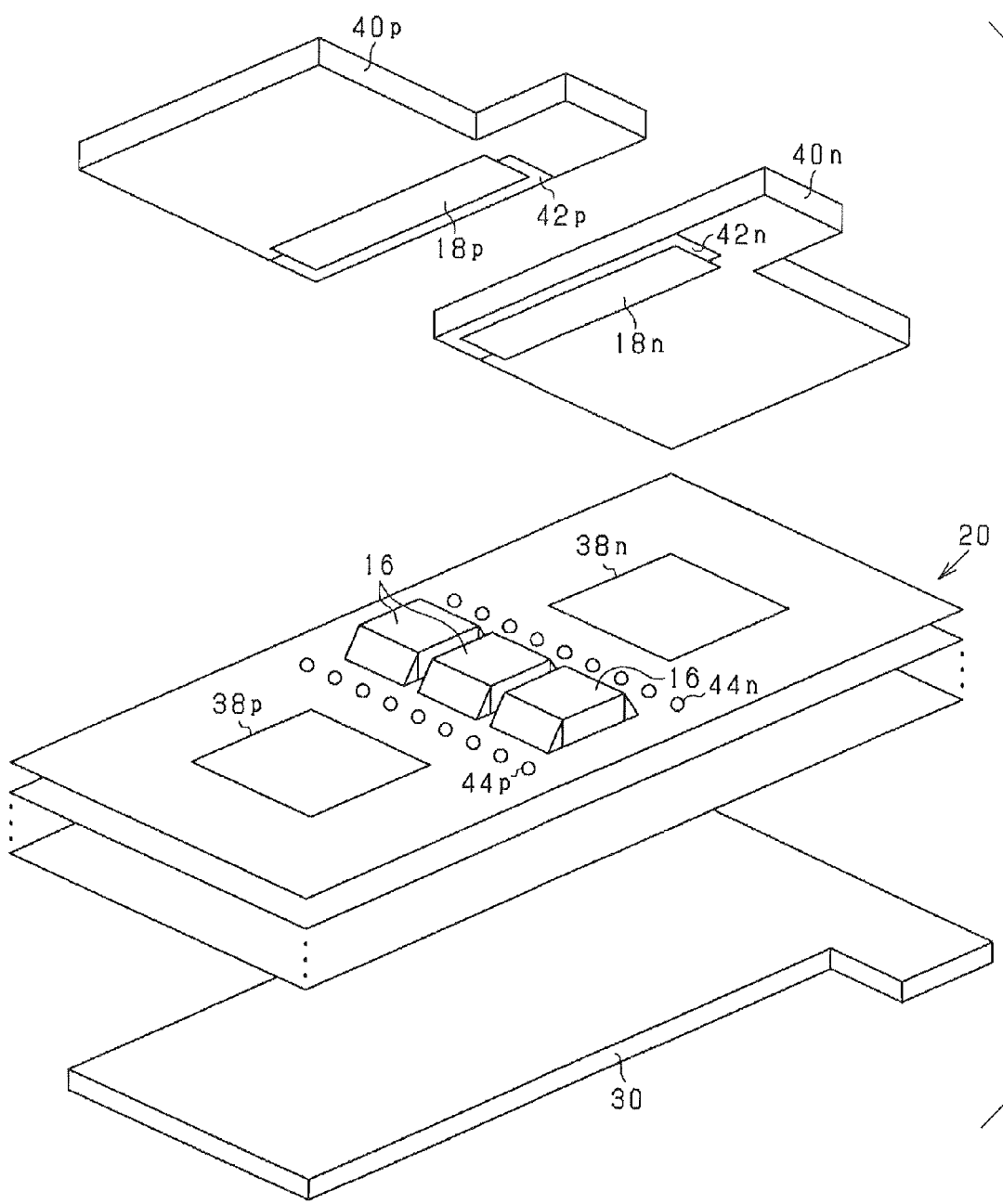
FIG. 4 is an exploded perspective view of the power module according to the first embodiment.

FIG. 4 is an exploded perspective view of the power module PM shown in FIG. 3. As shown in FIG. 4, the snubber resistor 18# (#=p, n) is disposed along the conductor 40# through the insulating film 42#.

In such a case, therefore, the snubber circuit SC is arranged parallel to a shortest path that connects between the wiring layer 34p and the wiring layer 34n, as shown in FIG. 2. The length of the via conductors 44p, 44n, 48p, 48n is sufficiently smaller than a distance between a projection area provided by vertically projecting the semiconductor chip 22p onto the wiring layer 34p and a projection area provided by vertically projecting the semiconductor chip 22n onto the wiring layer 34n. Therefore, the wiring layers 34p, 34n are connected to each other through the snubber circuit SC. The length of the connecting path between the wiring layer 34p and the wiring layer 34n substantially corresponds to the length required to the snubber circuit SC.

In the above described configuration, the current path between the snubber circuit SC and the semiconductor chip 22p and the current path between the semiconductor chip 22p and the wiring layer 26 are opposed to each other. Further, a current direction in the current path between the snubber circuit SC and the semiconductor chip 22p and a current direction in the current path between the semiconductor chip 22p and the wiring layer 26 are opposite to each other. As such, the inductance in the paths can be reduced.

Likewise, the current path between the snubber circuit SC and the semiconductor chip 22n and the current path between the semiconductor chip 22n and the wiring layer 26 are opposed to each other. Further, a current direction in the current path between the snubber circuit SC and the semiconductor chip 22n and a current direction in the current path between the semiconductor chip 22n and the wiring layer 26 are opposite to each other. As such, the inductance in the paths can be reduced.

Also, the path of the electric current (high-frequency current) that varies in accordance with the switching state of the high-potential side switching element Swp and the low-potential side switching element Swn can be formed in the short-loop manner. That is, the current path in such a case has a loop shape including the snubber circuit SC, the wiring layer 34p, the semiconductor chip 22p, the wiring layer 26, the semiconductor chip 22n and the wiring layer 34n. The looped current path is very small and is determined by the thickness of the multilayer board 20. Therefore, even if the high-frequency current occurs in the looped current path, the surge and the radiation noise can be reduced.

In addition, the snubber resistors 18p, 18n and the conductors 40p, 40n are disposed on top of the other. Therefore, the heat generated from the snubber resistors 18a, 18b are favorably radiated through the conductors 40p, 40n. The multilayer board 20 may be provided by a stack of thermoplastic resin films stacked by thermo-pressing.

In the present embodiment, the following advantageous effects are achieved.

(1) The snubber resistor 18# (#=p, n) is disposed along the conductor 40. Therefore, the heat generated from the snubber resistor 18# is favorably radiated through the conductor 40#.

(2) The terminals TP, TN of the power module PM are provided by the conductors 40p, 40n, respectively. The thickness and/or the surface area of the conductors 40p, 40n can be easily increased within the power module PM. Therefore, the heat radiation function for radiating heat from the snubber resistor 18# can improve.

(3) The conductor 40p has an elongated portion that extends from the projection area defined by vertically projecting the semiconductor chip 22p to the clearance between the conductors 40p, 40n. Further, the snubber resistor 18p is disposed along the elongated portion of the conductor 40p. Therefore, the current path of the snubber circuit SC can be shortened.

(4) The conductor 40n has an elongated portion that extends from the projection area defined by vertically projecting the semiconductor chip 22n to the clearance between the conductors 40p, 40n. Further, the snubber resistor 18n is disposed along the elongated portion of the conductor 40n. Therefore, the current path of the snubber circuit SC can be shortened.

(5) The power module PM includes the snubber resistor 18p disposed along the conductor 40p and the snubber resistor 18n disposed along the conductor 40n. That is, the snubber circuit 18p, 18n are respectively provided in the high-potential side and the low-potential side. Therefore, the resistance value of the snubber resistor can be easily ensured. Also, the heat generated from the snubber resistor can be divided between the conductors 40p, 40n.

(6) The insulating film 42# is disposed between the most part of the snubber resistor 18# and the conductor 40#. Therefore, the current flowing area is not defined by the area of the surface of the snubber resistor 18# opposed to the conductor 40#. As such, the resistance value can be easily maintained.

(7) The capacitor 16 of the snubber circuit SC is provided by the parallel connection unit including the multiple capacitors. Therefore, the current path is favorably formed into the short-loop while maintaining an electrostatic capacitance.

In a case where the capacitor having the large surface area is employed so as to maintain the electrostatic capacitance, stress due to the change in temperature is likely to increase. If the capacitor is separated from the insulating member so as to reduce an influence due to the temperature change, the advantageous effect of the short-looped current path reduces.

(8) The wiring layer 34b connecting between the semiconductor chip 22p and the snubber circuit SC, the wiring layer 34n connecting between the semiconductor chip 22n and the snubber circuit SC, and the wiring layer 26 connecting between the semiconductor chip 22p and the semiconductor chip 22n are formed as the wirings of the multilayer board 20 in which the semiconductor chip 22p and the semiconductor chip 22n are embedded.

Therefore, the current path where the electric current is suddenly changed in accordance with the change in the switching state can be sufficiently reduced. As such, the parasitic inductance can be sufficiently reduced, and the radiation noise in the current path can be reduced.

<Second Embodiment>

A second embodiment will be described with reference to FIG. 5. Hereinafter, a structure different from the first embodiment will be mainly described.

Figure 5:
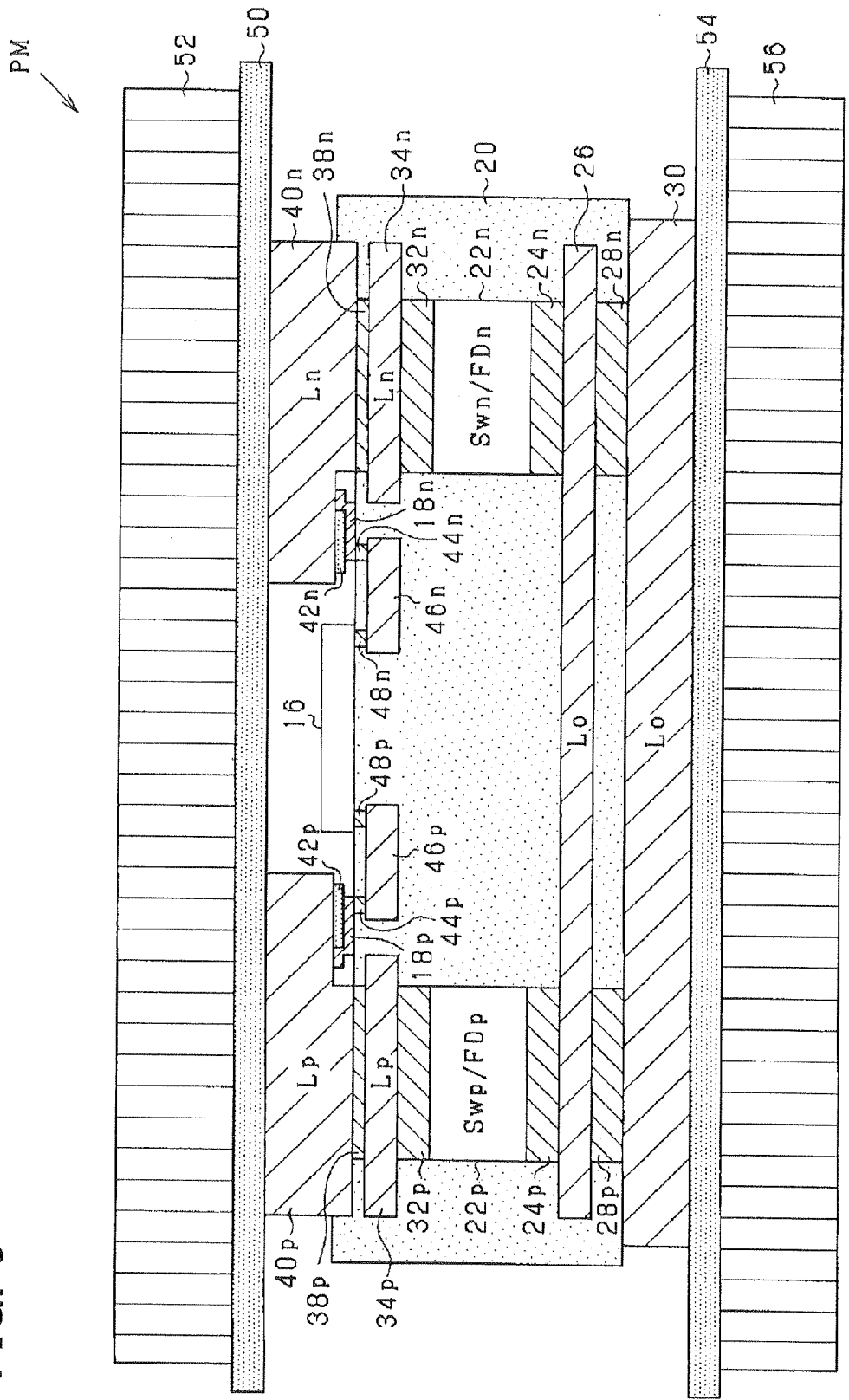
FIG. 5 is a cross-sectional view of a power module of a switching device according to a second embodiment.

FIG. 5 is a cross-sectional view of a power module PM according to the present embodiment. In FIG. 5, parts corresponding to the parts shown in FIG. 2 are designated with like reference symbols.

As shown in FIG. 5, the thickness of the conductor 40# (#=p, n) is reduced at a portion where the snubber resistor 18# is disposed smaller than a portion corresponding to the projection area of the semiconductor chip 22#. In other words, the thickness of the elongated portion is smaller than that of the remaining portion of the conductor 40#.

In such a case, the snubber resistor 18# and the insulating film 42# are formed on the surface of the multilayer board 20. Therefore, the number of layers of the multilayer board 20 can be reduced, and the structure of the multilayer board 20 can be simplified.

For example, the portion having the smaller thickness of the conductor 40# can be formed by cutting, pressing, or the like.

<Third Embodiment>

A third embodiment will be described with reference to FIG. 6. Hereinafter, a structure different from the first embodiment will be mainly described.

Figure 6:
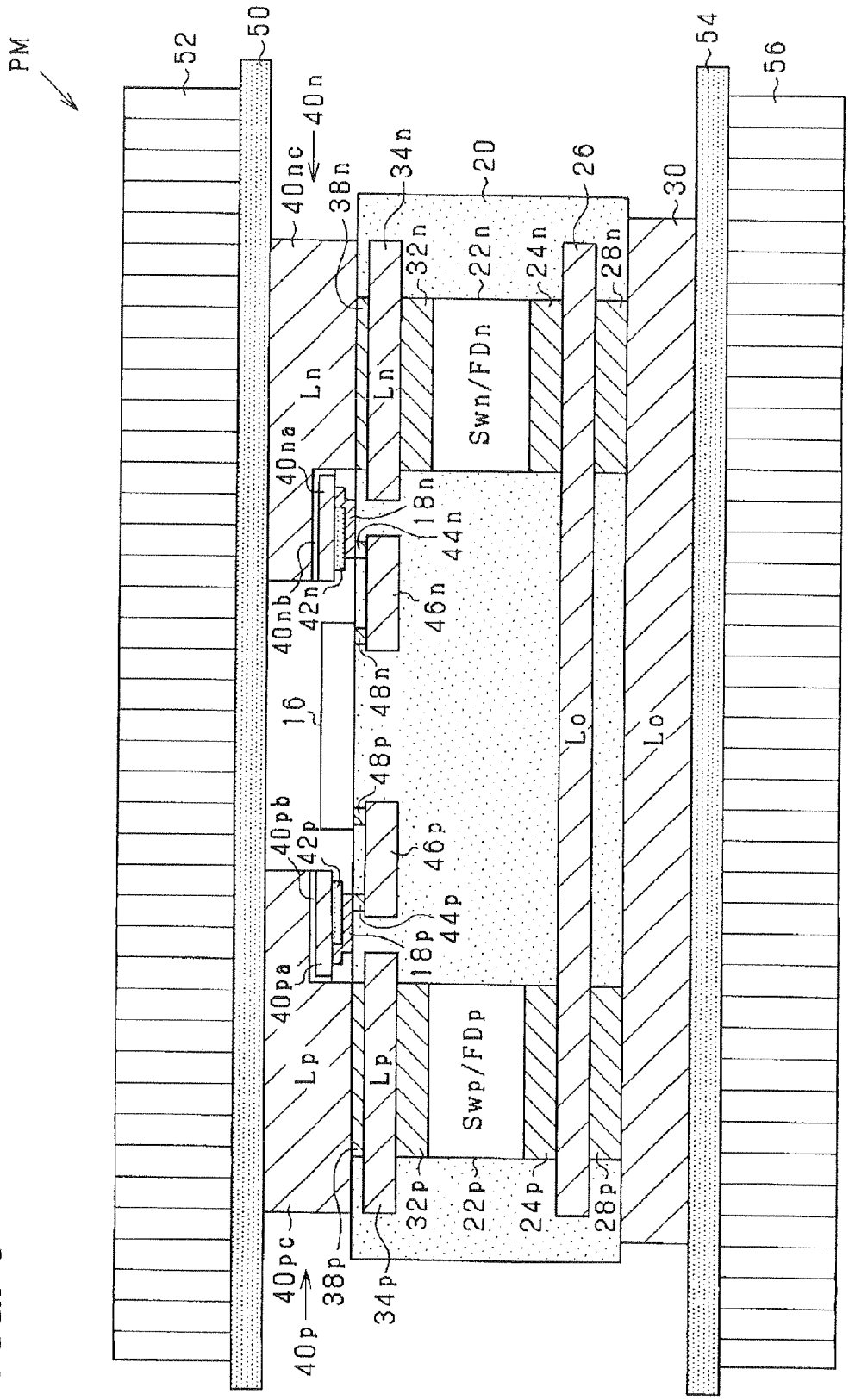
FIG. 6 is a cross-sectional view of a power module of a switching device according to a third embodiment.

FIG. 6 is a cross-sectional view of a power module PM according to the present embodiment. In FIG. 6, parts corresponding to the parts shown in FIG. 2 are designated with like reference symbols.

As shown in FIG. 6, a portion 40#a of the conductor 40# (#=p, n) is connected to a remaining portion 40#c of the conductor 40# through a connecting portion 40#b such as a solder. The portion 40#a provides a portion along which the snubber resistor 18# is disposed. In such a case, usage efficiency of the material improves in manufacturing the snubber resistor 18#.

That is, the portion 40#a is bonded with the remaining portion 40#c after the insulating film 42# and the snubber resistor 18# are formed on the portion 40#a. As compared with a case where the materials of the insulating film 42# and the snubber resistor 18# are directly formed on the conductor 40#, the amount of materials that are removed due to the patterning of the insulating film 42# and the snubber resistor 10#, that is, the amount of the materials of the insulating film 42# and the snubber resistor 18# and the amount of the masking material, can be reduced. Therefore, the usage efficiency of the materials improves.

<Fourth Embodiment>

A fourth embodiment will be described with reference to FIGS. 7 and 8. Hereinafter, a structure different from the first embodiment will be mainly described.

Figure 7:
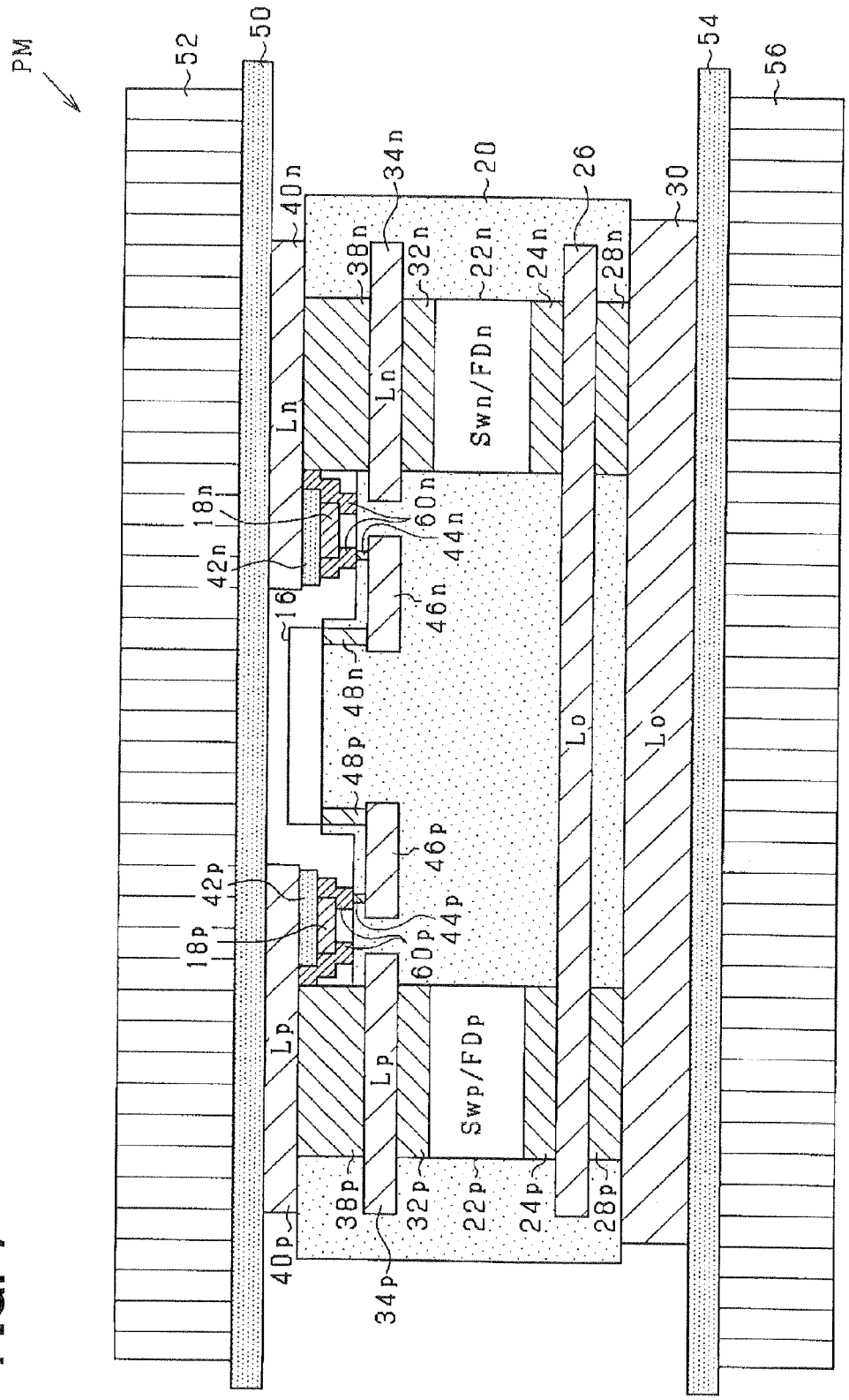
FIG. 7 is a cross-sectional view of a power module of a switching device according to a fourth embodiment.

FIG. 7 is a cross-sectional view of a power module PM according to the present embodiment. In FIG. 7, parts corresponding to the parts shown in FIG. 2 are designated with like reference symbols.

As shown in FIG. 7, an electrode material 60# (#=p, n) such as copper is disposed to connect between the snubber resistor 18# and the conductor 40# and via conductor 38#, and between the snubber resistor 18# and the via conductor 44#. The electrode material 60# has a resistivity smaller than that of the snubber resistor 18#.

Figure 8:
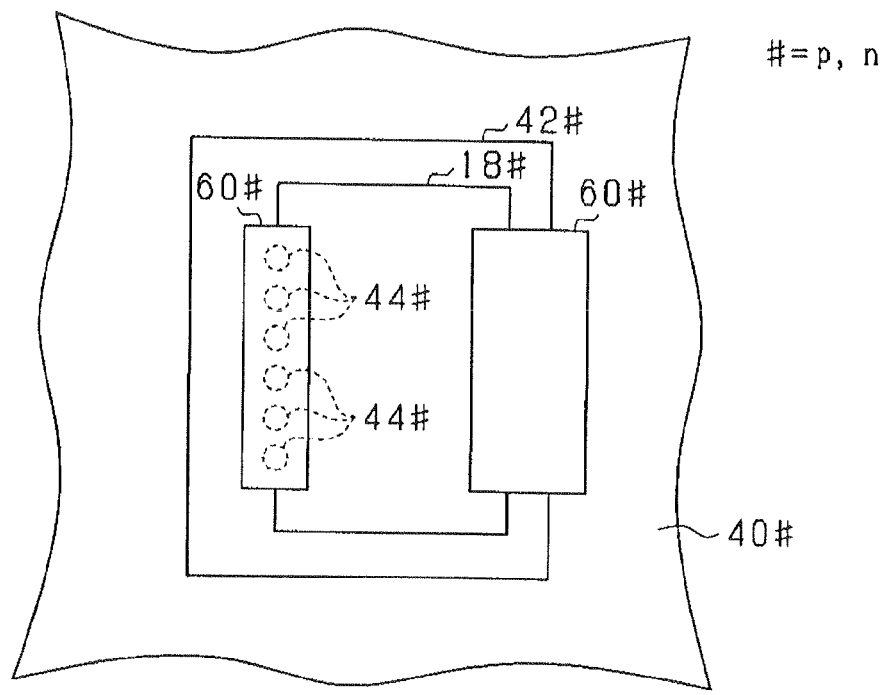
FIG. 8 is a schematic plan view of a connection surface between an electrode material and a multilayer board of the power module according to the fourth embodiment.

FIG. 8 is a schematic plan view of a connection surface between the electrode material 60# and the multilayer board 20. As shown in FIG. 8, the electrode material 60# is formed to cover the top surfaces of the via conductor 44#. Therefore, unevenness of the resistance value at the connecting portion between the snubber resistor 18# and the conductor 40# and at a position adjacent to the connecting portion between the snubber resistor 18# and the via conductor 44# is reduced. Therefore, localization of the electric current is restricted.

<Fifth Embodiment>

A fifth embodiment will be described with reference to FIG. 9. Hereinafter, a structure different from the first embodiment will be mainly described.

Figure 9:
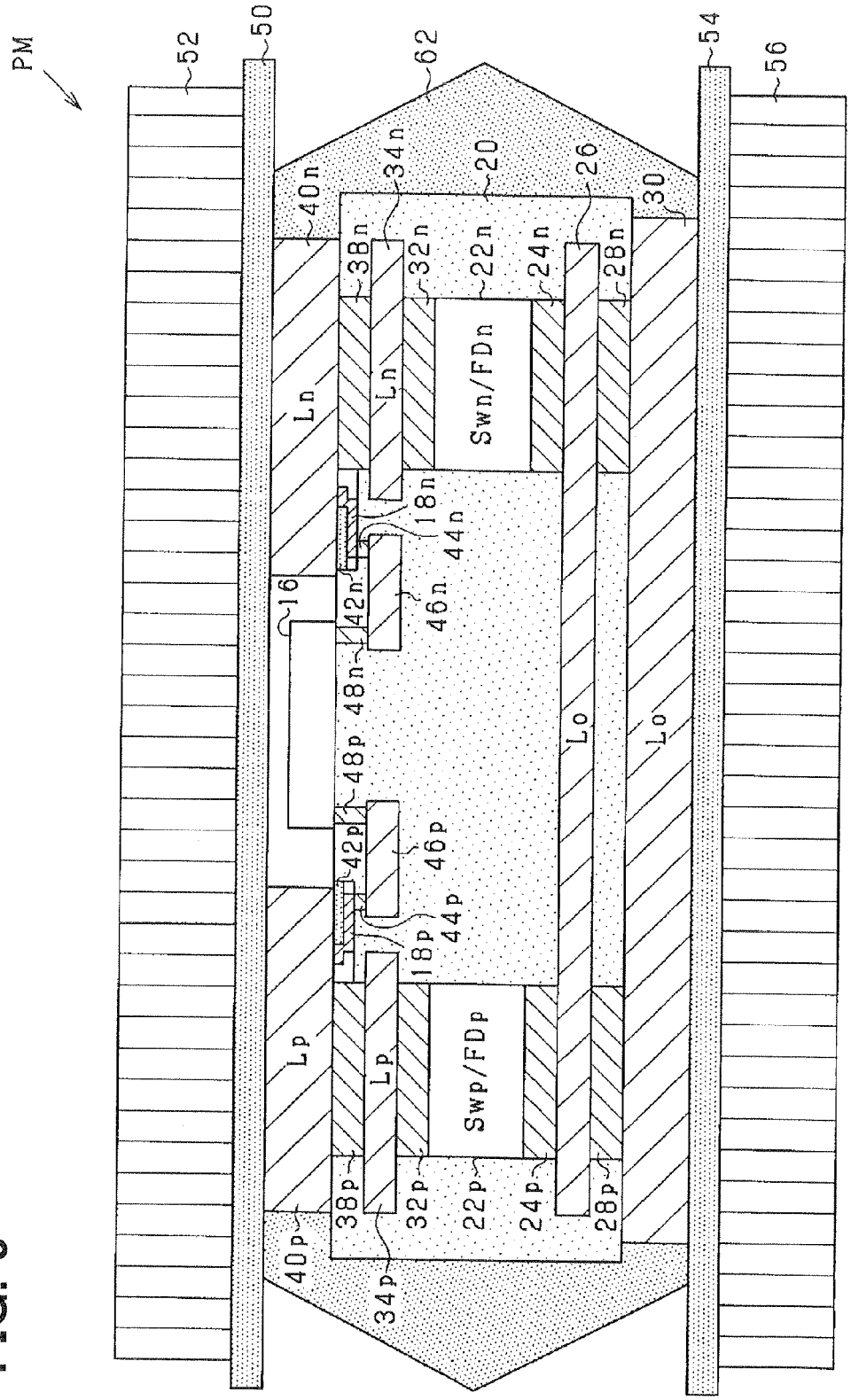
FIG. 9 is a cross-sectional view of a power module of a switching device according to a fifth embodiment.

FIG. 9 is a cross-sectional view of a power module PM according to the present embodiment. In FIG. 9, parts corresponding to the parts shown in FIG. 2 are designated with like reference symbols.

As shown in FIG. 9, the power module PM is covered with a molding material 62 except for the heat radiation surfaces of the conductors 30, 40# contacting the insulating films 50, 54. In such a structure, the terminals of the power module PM, such as the terminals TP, TN, TO shown in FIG. 4, and the gates are not fully covered with the molding material 62 to enable electric connection with external devices or external members.

In such a structure, firstly, the rigidity of the power module PM can be increased. Secondly, the insulating property between the conductors 30, 40# can be improved. That is, when a high voltage is applied between the conductors 30, 40#, an occurrence of breakdown is reduced, as compared with a case where the power module PM is not covered with the molding material 62, that is, exposed to the air. The molding material 62 is made of a thermosetting resin, such as an epoxy resin.

<Sixth Embodiment>

A sixth embodiment will be described with reference to FIGS. 10 and 11. Hereinafter, a structure different from the first embodiment will be mainly described.

Figure 10:
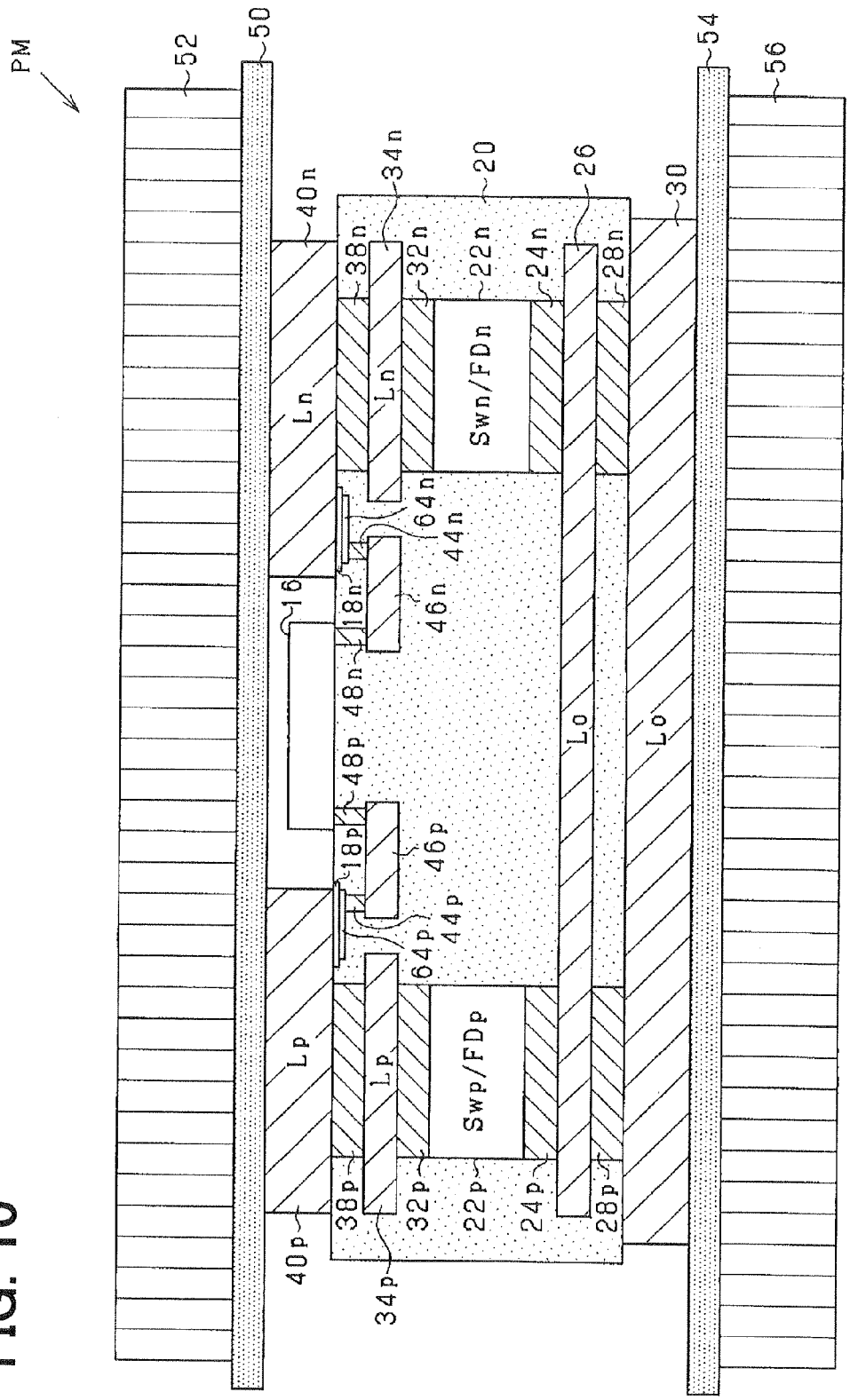
FIG. 10 is a cross-sectional view of a power module of a switching device according to a sixth embodiment.

FIG. 10 is a cross-sectional view of the power module PM according to the present embodiment. In FIG. 10, parts corresponding to the parts shown in FIG. 2 are designated with like reference symbols.

As shown in FIG. 10, the power module PM does not have the insulating film 42# between the snubber resistor 18# and the conductor 40#. Therefore, the resistance value of the snubber resistor 18# can be adjusted by the thickness.

Further, an electrode material 64# (#=p, n) is disposed between the snubber resistor 18# and the via conductor 44#. The electrode material 64# has a resistivity smaller than that of the snubber resistor 18#. The electrode material 64# is, for example, copper.

Figure 11:
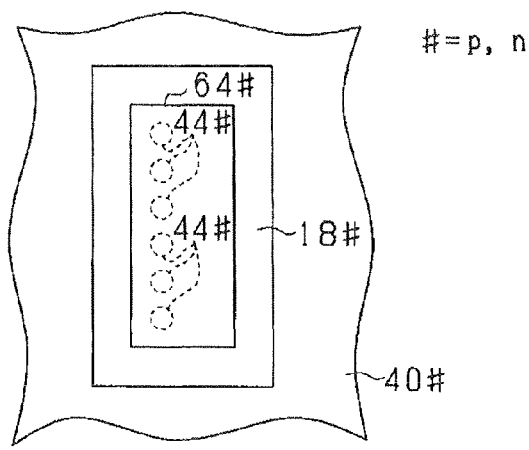
FIG. 11 is a schematic plan view of a connection surface between an electrode material and a via conductor of the power module according to the sixth embodiment.

FIG. 11 is a schematic plan view of a connection surface between the electrode material 64# and the via conductor 44#. As shown in FIG. 11, the electrode material 64# is formed to fully cover the surface of the via conductor 44. The electrode material 64# insulates direct electrical connection between the via conductor 44# and the snubber resistor 18#.

In such a case, unevenness of the resistivity at the connection part with the via conductor 44# is reduced, and hence localization of the electric current is restricted. Further, the snubber resistor 18# is disposed to fully cover the surface of the electrode material 64#. Therefore, breakdown between the electrode material 64# and the conductor 40# can be favorably reduced.

<Seventh Embodiment>

A seventh embodiment will be described with reference to FIGS. 12 and 13. Hereinafter, a structure different from the first embodiment will be mainly described.

Figure 12:
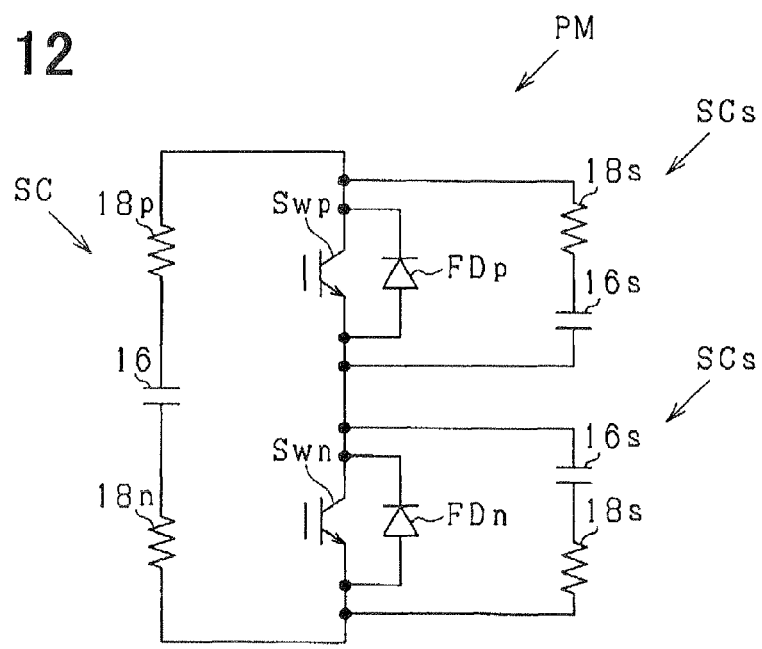
FIG. 12 is a schematic circuit diagram of a power module of a switching device according to a seventh embodiment.

FIG. 12 is a circuit diagram of a power module PM according to the present embodiment. In FIG. 12, parts corresponding to the parts shown in FIG. 1 are designated with like reference symbols.

As shown in FIG. 12, an individual snubber circuit SCs is connected to an input terminal and an output terminal of each of the high-potential side switching element Swp and the low-potential side switching element Swn. The individual snubber circuit SCs is a series connection unit in which a resistor 18s and a capacitor 16s are connected in series.

Since the individual snubber circuit SCs is connected to each of the switching elements Swp, Swn, the surge can be favorably reduced. Firstly, the individual snubber circuit SCs reduces the speed of the voltage change between the input terminal and the output terminal of the switching element Swp, Swn when the switching element Swp, Swn is switched from the on state to the of state. Therefore, the surge is restricted. Secondly, the individual snubber circuit SCs reduces the speed of the voltage change when the voltage is applied to the both ends due to the sudden change in the electric current in accordance with a recovery phenomenon of the free wheel diode FDp, FDn. Therefore, the surge is restricted.

Figure 13:
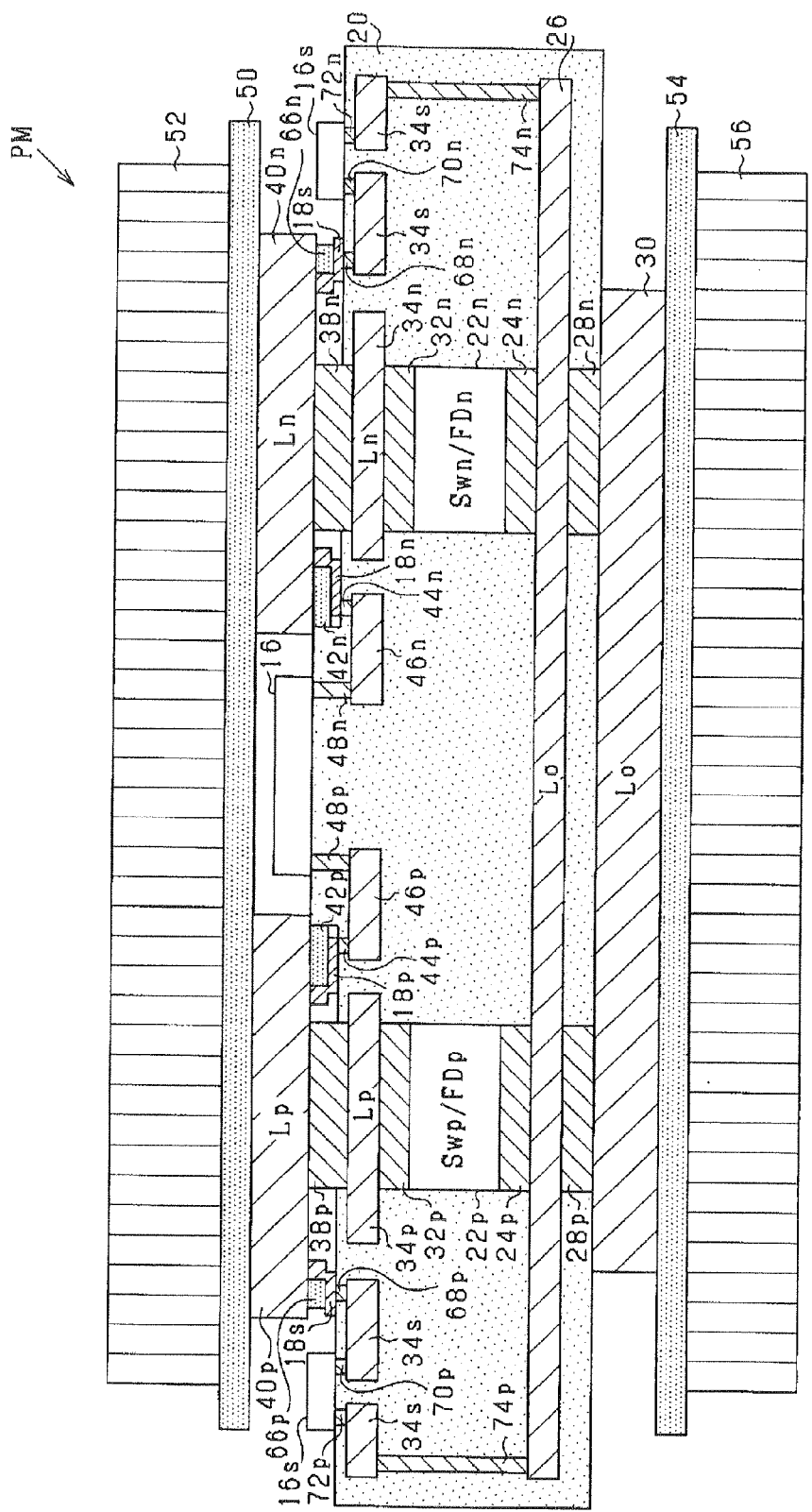
FIG. 13 is a cross-sectional view of the power module according to the seventh embodiment.

FIG. 13 is a cross-sectional view of the power module PM according to the present embodiment. In FIG. 13, parts corresponding to the parts shown in FIG. 2 are designated with like reference symbols.

As shown in FIG. 13, the conductor 40# (#=p, n) is elongated from the projection area defined by vertically projecting the semiconductor chip 22# to a direction opposite to the clearance between the conductor 40p and the conductor 40n, in addition to the direction toward the clearance between the conductor 40p and the conductor 40n. That is, the conductor 40# is elongated from the projection area to the opposite sides with respect to the alignment direction of the conductors 40p, 40n.

An insulating film 66# and the snubber resistor 18s are disposed along the elongated portion of the conductor 40# on a side opposite to the clearance with respect to the alignment direction of the conductors 40#. The snubber resistor 18s is connected to a wiring layer 34s, which is at the same layer as the wiring layer 34#, through a via conductor 68#. The wiring layer 34s is connected to one of terminals of the capacitor 16s through a via conductor 70#.

Further, the wiring layer 34s, which is at the same layer as the wiring layer 34#, is also formed to correspond to the other terminal of the capacitor 16s, and is connected to the wiring layer 26 through a via conductor 74#.

In such a configuration, the current path between the semiconductor chip 22# and the wiring layer 34s and the current path between the semiconductor chip 22# and the wiring layer 26 are opposed to each other, and the direction of the electric current is opposite between these current paths. Therefore, the parasitic inductance of the wiring layer 34#, 26 can be reduced.

Further, the current path connecting between the both ends of the switching element Sw# and the free wheel diode FD# and the individual snubber circuit SCs is formed in a short-loop manner. Therefore, the parasitic inductance of the individual snubber circuit SCs can be reduced, and the radiation noise can be reduced.

<Eighth Embodiment>

An eighth embodiment will be described with reference to FIG. 14 and FIGS. 15A through 15C. Hereinafter, a structure different from the first embodiment will be mainly described.

Figure 14:
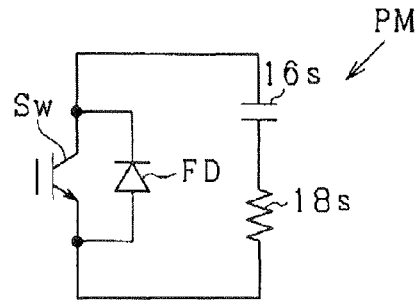
FIG. 14 is a schematic circuit diagram of a power module of a switching device according to an eighth embodiment.

FIG. 14 is a circuit diagram of a power module PM according to the present embodiment. In FIG. 14, parts corresponding to the parts shown in FIG. 1 are designated with like reference symbols.

As shown in FIG. 14, the power module PM of the present embodiment is constructed of the single switching element Sw, the free wheel diode FD connected in anti-parallel with the switching element Sw, and the individual snubber circuit SCs connected in parallel with the switching element Sw and the free wheel diode FD. The individual snubber circuit SCs is a series connection unit in which the resistor 18s and the capacitor 16s are connected in series.

Figure 15A:
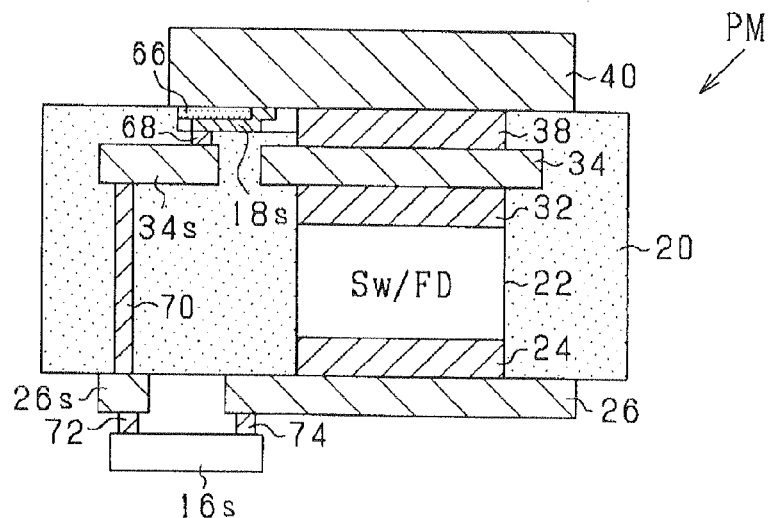
FIG. 15A is a schematic cross-sectional view of an example of the power module according to the eighth embodiment.

FIG. 15A illustrates an example of the power module PM according to the present embodiment.

As shown in FIG. 15A, the surface of the semiconductor chip 22 on which the collector and the cathode are formed is connected to the wiring layer 26 formed on the surface of the multilayer board 20 through the via conductor 24. The wiring layer 34 is disposed on the surface of the semiconductor chip 22 on which the emitter, the gate and the anode are formed through the via conductor 32. The portion of the wiring layer 34 to which the emitter and the anode of the semiconductor chip 22 are connected is connected to a conductor 40 disposed on the multilayer board 20 through the via conductor 38.

The conductor 40 serves as the wiring of the semiconductor chip 22. In addition, the conductor 40 serves as a heat spreader for radiating the heat generated from the semiconductor chip 22. To serve as the heat spreader, the conductor 40 has a surface area larger than that of the semiconductor chip 22, and a sufficient height.

The insulating film 66 and the snubber resistor 18s are disposed along the elongated portion of the conductor 40 elongating from the projection area defined by vertically projecting the semiconductor chip 22 onto the conductor 40. The insulating film 66 covers most part of the snubber resistor 18s, but a portion of the snubber resistor 18s is not covered with the insulating film 66 and is connected to the conductor 40.

An end of the snubber resistor 18s opposite to the conductor 40 is connected to the wiring layer 34s through the via conductor 68. The wiring layer 34s is at the same layer as the wiring layer 34. The wiring layer 34s is connected to a wiring layer 26s formed on the surface of the multilayer board 20 through a via conductor 70. The wiring layers 26, 26s are connected to the capacitor 16s through conductors 72, 74, respectively.

In such a configuration, the current path of the individual snubber circuit SCs is formed into the short-loop manner.

Figure 15B:
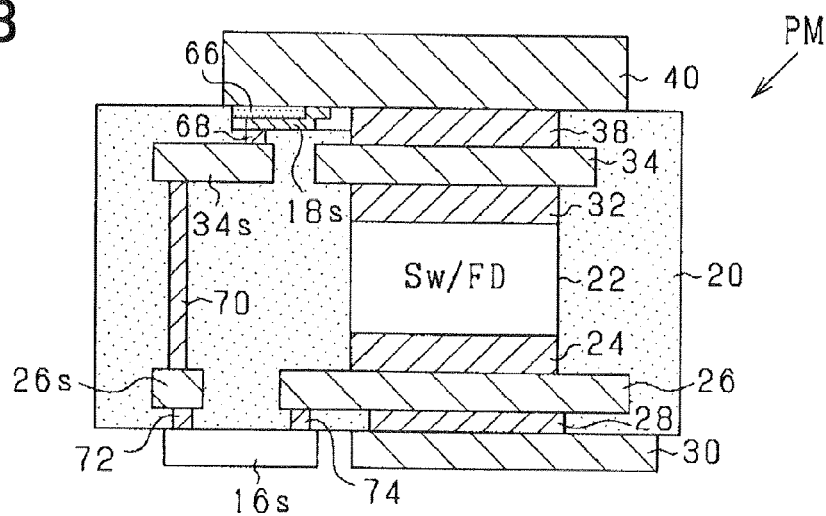
FIG. 15B is a schematic cross-sectional view of another example of the power module according to the eighth embodiment.

FIG. 15B illustrates another example of the power module PM according to the present embodiment. In the example of FIG. 15B, the wiring layers 26, 26s are also embedded in the multilayer board 20. Therefore, the conductors 72, 74 are provided as via conductors embedded within contact holes of the multilayer board 20. The wiring layer 26 is connected to the conductor 30 formed on the surface of the multilayer board 20 through a via conductor 28.

Figure 15C:
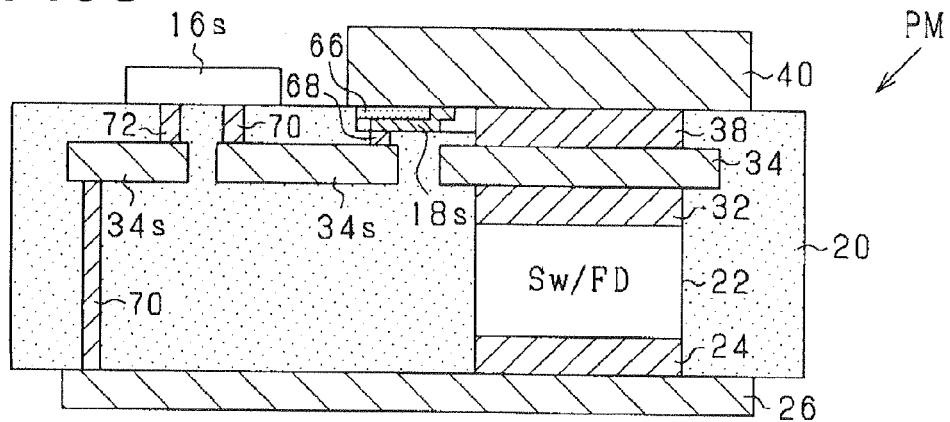
FIG. 15C is a schematic cross-sectional view of further another example of the power module according to the eighth embodiment.

FIG. 15C illustrates further another example of the power module PM according to the present embodiment. In the example of FIG. 15C, the capacitor 16s is disposed on the surface of the multilayer board 20, the surface being adjacent to the snubber resistor 18s.

In this case, the current path of the individual snubber circuit SCs is slightly larger than that of FIG. 15A. However, in a case where the arrangement position of the capacitor 16s is limited, such a structure is adaptable.

<Ninth Embodiment>

A ninth embodiment will be described with reference to FIG. 16. Hereinafter, a structure different from the first embodiment will be mainly described.

Figure 16:
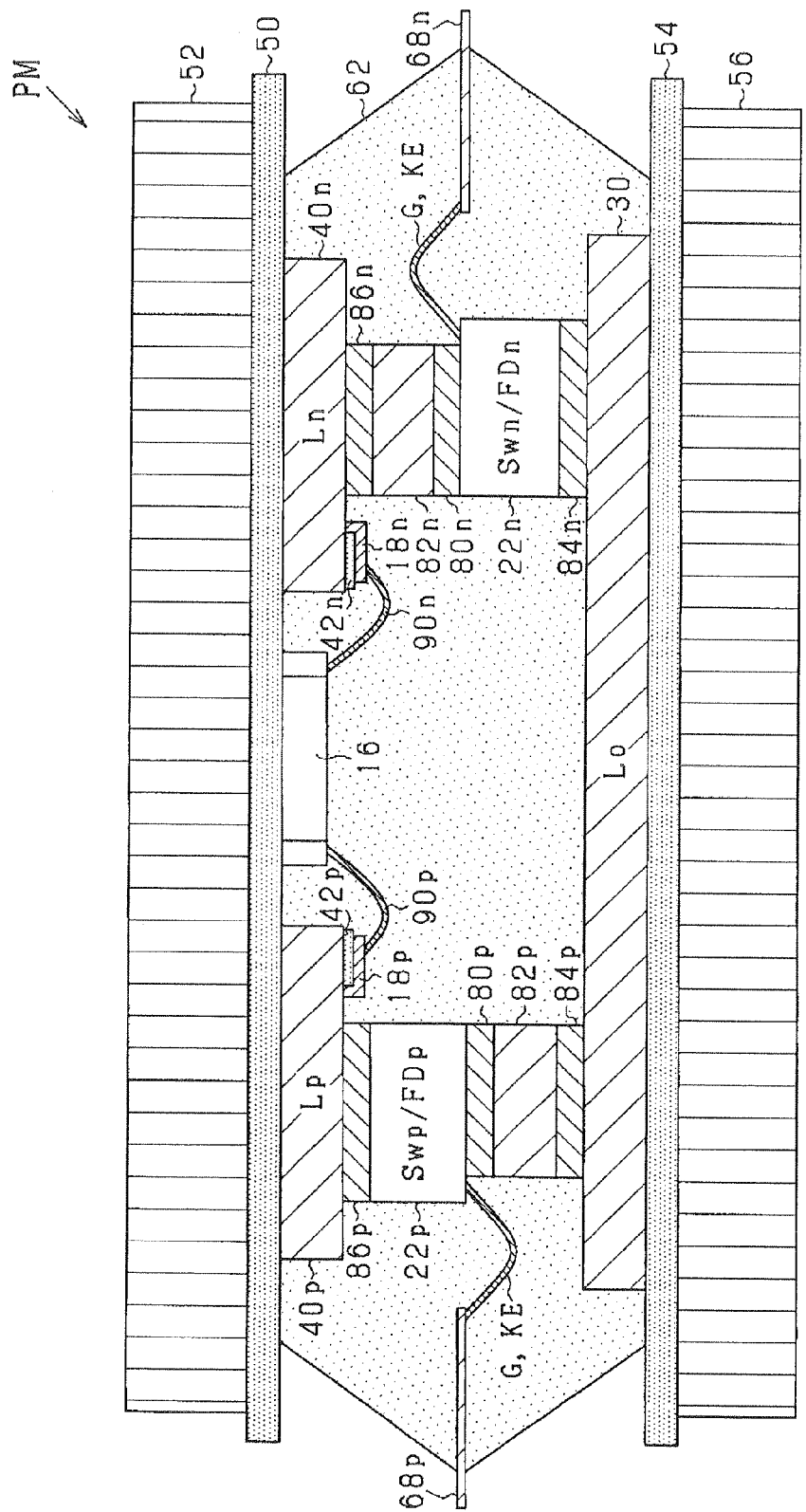
FIG. 16 is a cross-sectional view of a power module of a switching device according to a ninth embodiment.

FIG. 16 is a cross-sectional view of the power module PM according to the present embodiment. In FIG. 16, parts corresponding to the parts shown in FIG. 1 are designated with like reference symbols.

As shown in FIG. 16, a conductive spacer 82p is connected to the surface of the semiconductor chip 22p on which the emitter and the anode are connected through a solder 80p. Further, the conductor 30 is connected to the conductive spacer 82p through a solder 84p. The conductor 40p is connected to the surface of the semiconductor ship 22p on which the collector and the cathode are formed through a solder 86p.

The conductor 30 is connected to the surface of the semiconductor chip 22n on which the collector and the cathode are formed through a solder 84n. A conductive spacer 82n is connected to the surface of the semiconductor chip 22n on which the emitter and the anode are formed through a solder 80n. The conductor 40n is connected to the conductive spacer 82n through a solder 86n.

The gate and a Kelvin emitter electrode of the semiconductor chip 22p are connected to terminals 68p through bonding wires G, KE. The gate and a Kelvin emitter electrode of the semiconductor chip 22n are connected to terminals 68n through bonding wires G, KE. The Kelvin emitter electrode has a potential equal to that of the emitter of the IGBT, but does not output a large electric current. The Kelvin emitter electrode is provided to obtain a reference potential of a drive circuit of the switching element Sw#.

In addition, arbitrary terminals (electrode) connected to the drive circuit, such as a terminal connected to a sense terminal may be also connected to the bonding wires. The sense terminal is provided to output a minute electric current that has a correlation with an electric current flowing between a pair of terminals of the switching element Swp.

The conductor 40# (#=p, n) is elongated toward the clearance between the conductors 40p, 40n from the projection area defined by vertically projecting the semiconductor chip 22#. The insulating film 42# and the snubber resistor 18# are disposed along the elongated portion of the conductor 40#.

The insulating film 42# covers the most part of the snubber resistor 18#. However, the portion of the snubber resistor 18# is not covered with the insulating film 42# and is connected to the conductor 40#. The snubber resistor 18# is connected to the capacitor 16 through a bonding wire 90#.

The conductive spacer 82# is a conductor having a predetermined thickness so as to maintain a space for the arrangement of the bonding wire. The conductive spacer 82# is made of copper, for example.

The semiconductor chip 22#, the conductive spacer 82# and the like are covered with the molding material 62. In such a structure, the path of the electric current (high-frequency current) that varies in accordance with the change in the switching state of the switching element Swn and/or the witching element Swp is increased due to the space for the wire bonding, as compared with the case where the multilayer board 20 is employed. However, the path of the electric current can be still formed into the short-loop manner.

Various exemplary embodiments of the present invention are described hereinabove. However, the present invention is not limited to the above described exemplary embodiments, but may be implemented in various other ways without departing from the spirit of the invention. The above described exemplary embodiments may be modified in the following manners, for example.

(With Regard to the First and Second Conductors)

The conductor that is connected to the switching element Sw# (#=p, n) and disposed along the snubber resistor 18# is not limited to the conductor that forms the terminal of the power module PM. For example, in the example shown in FIG. 2, the wiring layer 34# may provide the terminal, and thus it is not necessary that the conductor 40# provide the terminal.

Even in a structure where the conductor does not contact the insulating member (multilayer board 20), the advantageous effect as described (1) of the first embodiment can be achieved.

The projection area defined by projecting the semiconductor chip 22# onto the conductor 40# is not limited to an area that is surrounded by the vertical planes vertically extending from sides (e.g., four sides) of the semiconductor chip 22#. For example, the projection area may be defined by projecting the semiconductor chip 22# onto the conductor 40# with respect to a direction perpendicular to a surface of the power module PM. Such a projection area is adaptable when the surface of the semiconductor chip 22# and the surface of the conductor 40# are not parallel with each other.

It is not always necessary that the conductor 40# has the elongated portion for the arrangement of the snubber resistor 18#. For example, in place of having the elongated portion, the via conductor 38# is formed to have the surface area smaller than that of the semiconductor chip 22#, and the snubber resistor 18# is disposed along a portion of the conductor 40# that does not contact the via conductor 38#.

(With Regard to the Snubber Resistor of the Snubber Circuit SC)

It is not always necessary that the snubber resistor 18# contacts the conductor disposed along the snubber resistor 18#. For example, in the example shown in FIG. 2, the snubber resistor 18# may contact the via conductor 38#, in place of contacting the conductor 40#.

It is not always necessary that the snubber circuit SC has both the high-potential side snubber resistor 18p and the low-potential side snubber resistor 18n. For example, the snubber circuit SC has only one of the snubber resistors 18p, 18n.

(With Regard to the Capacitor of the Snubber Circuit SC)

It is not always necessary that the capacitor of the snubber circuit is provided by the parallel connection unit including the multiple capacitors. Even in such a case, the advantageous effect (1) of the first embodiment can be still achieved.

(With Regard to the Snubber Circuit SC)

The structure of the snubber circuit SC is not limited to the series connection unit including the resistor and the capacitor connected in series. For example, the snubber circuit SC may further has a diode connected in series.

(With Regard to the Individual Snubber Circuit SCs)

The layout of the individual snubber circuit SCs is not limited to the example shown in FIG. 13 and the example shown in FIG. 15. For example, the layout of the individual snubber circuit SCs may be modified as shown in FIGS. 17 through 19.

Figure 17:
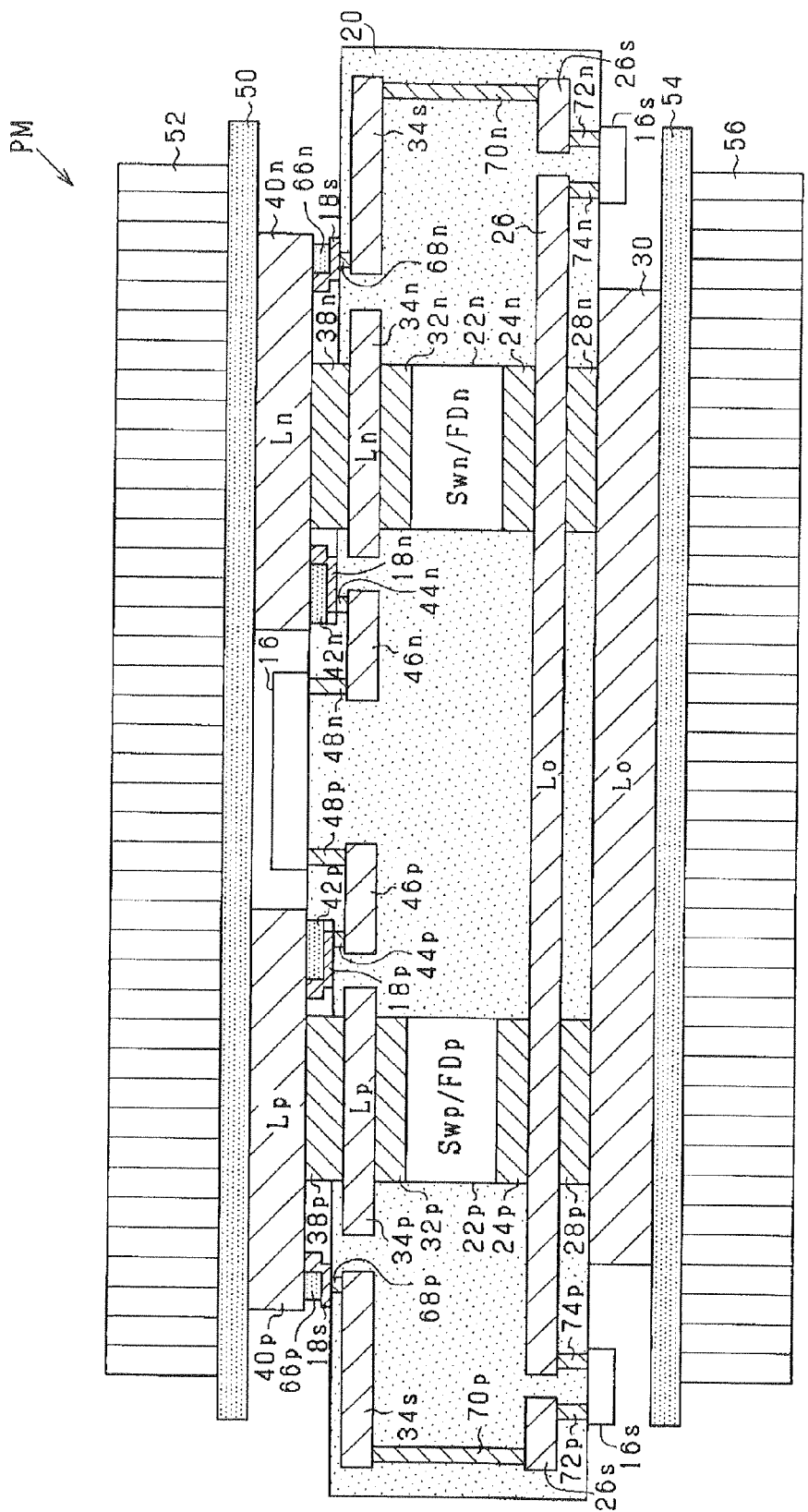
FIG. 17 is a cross-sectional view of a power module of a switching device as a modification of the seventh embodiment.

In the example shown in FIG. 17, the capacitor 16s is disposed on the surface of the multilayer board 20 opposite to the snubber resistor 18s. In such a case, the loop circuit provided by the individual snubber circuit SCs and the switching element Sw# can be reduced in size, as compared with the example shown in FIG. 13.

Figure 18:
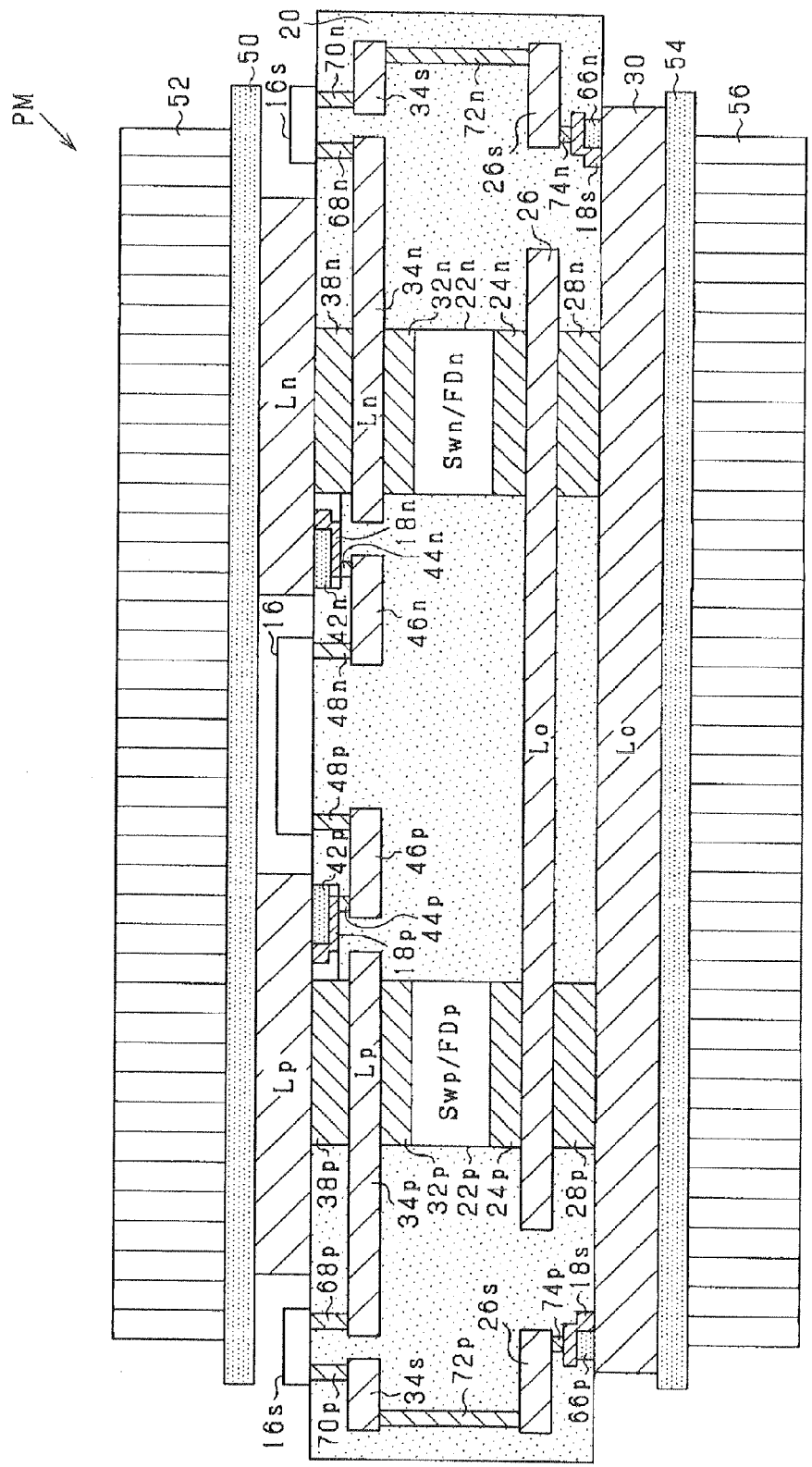
FIG. 18 is a cross-sectional view of a power module of a switching device as another modification of the seventh embodiment.
Figure 19:
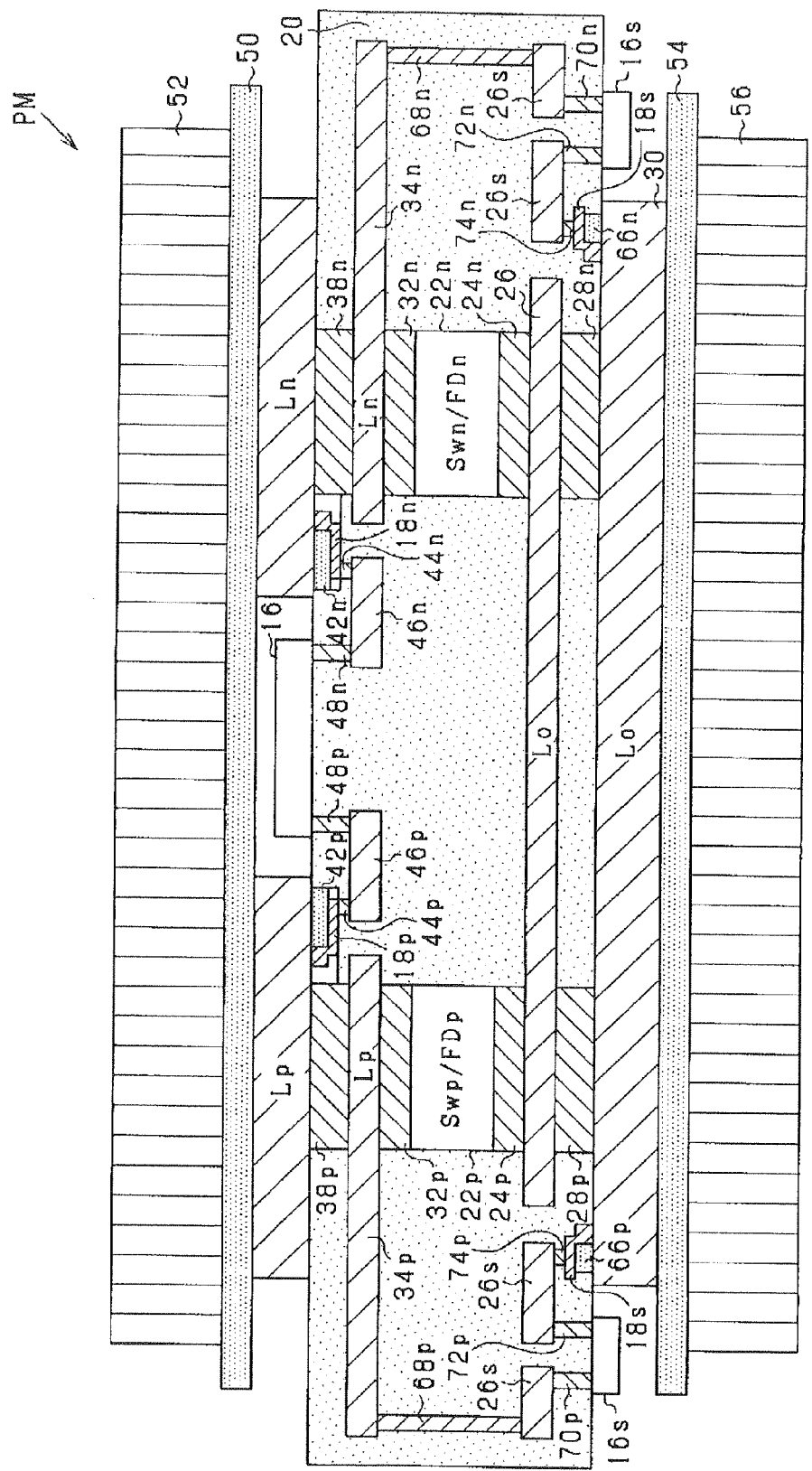
FIG. 19 is a cross-sectional view of a power module of a switching device as further another modification of the seventh embodiment.

In the examples shown in FIGS. 18 and 19, the series connection of the capacitor 16s and the snubber resistor 18s is revered from the series connection shown in FIG. 12. Likewise, in the examples shown in FIGS. 15A through 15C, the connection of the resistor 18s and the capacitor 16s may be reversed.

The individual snubber circuit SCs is not limited to the structure where the resistor is connected to one of the high-potential side terminal and the low-potential side terminal of the switching element. Alternatively, the individual snubber circuit SCs may be configured so that the resistor is connected to both of the high-potential side terminal and the low-potential side terminal of the switching element.

The individual snubber circuit SCs may be employed to the structure of the ninth embodiment shown in FIG. 16.

The individual snubber circuit SCs is not limited to the series connection unit including the resistor 18s and the capacitor 16s connected in series. For example, the individual snubber circuit SCs may further have a diode connected in series.

Figure 20A:
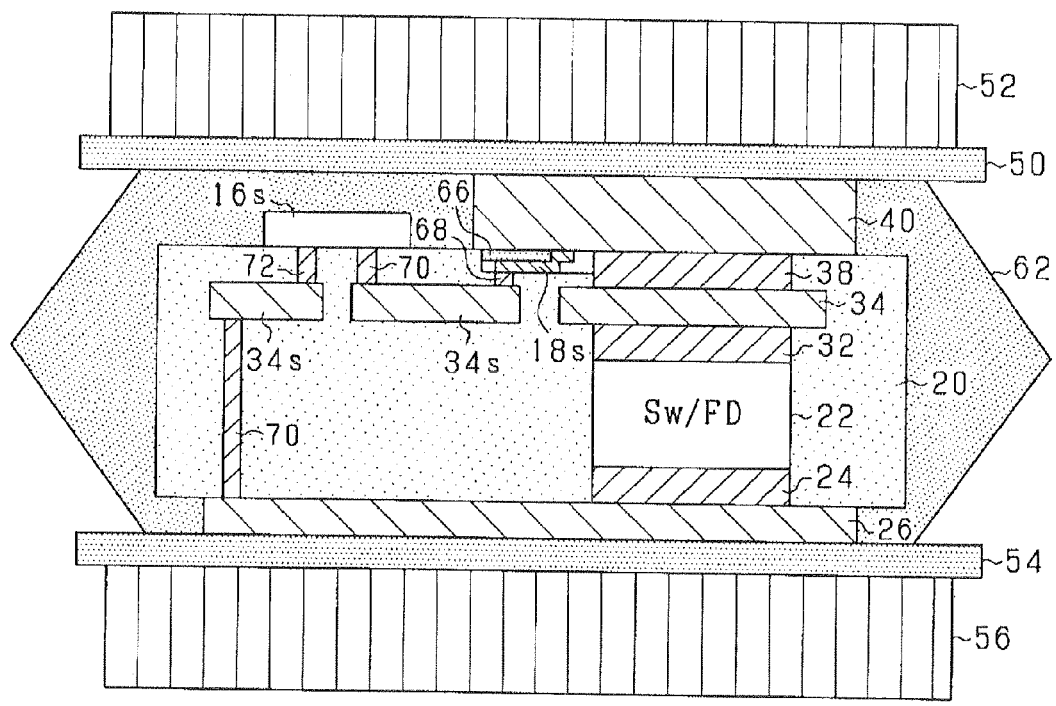
FIG. 20A is a cross-sectional view of a power module of a switching device as a modification of the eighth embodiment.

In the eighth embodiment, the power module PM may have the molding material 62 similar to the fifth embodiment. FIG. 20A is a cross-sectional view of the power module PM as a modification of the eighth embodiment.

In the example shown in FIG. 20A, the insulating films 50, 54 and the radiators 52, 56 are added, in addition to the molding material 62 of the fifth embodiment.

Figure 20B:
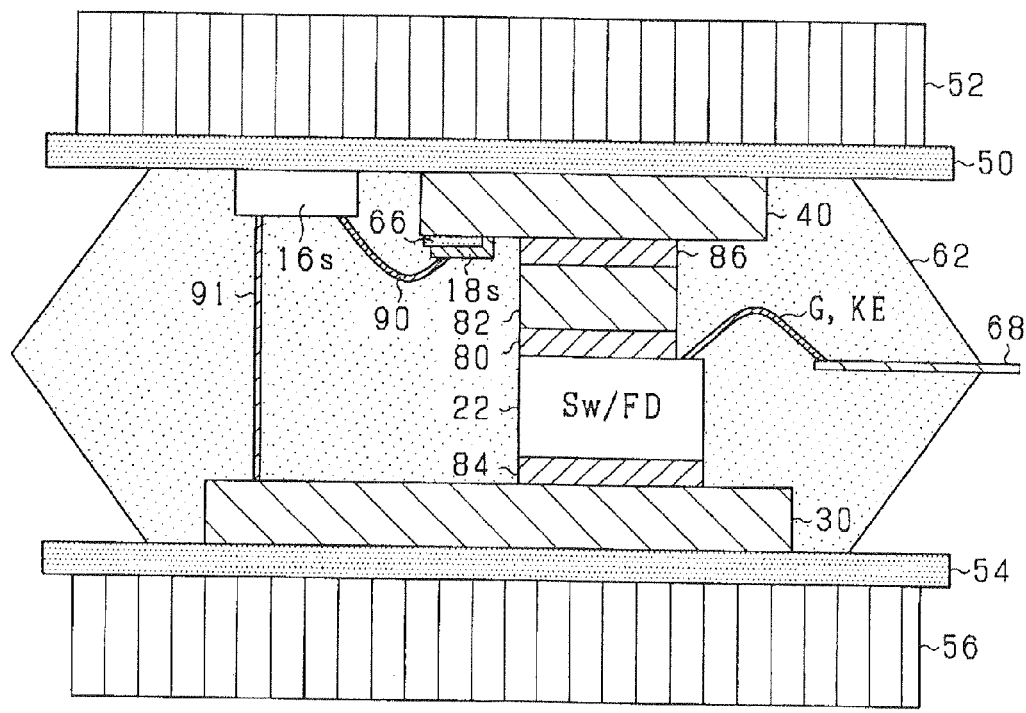
FIG. 20B is a cross-sectional view of a power module of a switching device as another modification of the eighth embodiment.

In the eighth embodiment, the power module PM may employ the molding material 62 similar to the ninth embodiment, in place of the multilayer board 20. FIG. 20B illustrates such an example. In FIG. 20B, the parts corresponding to the parts shown in FIGS. 15A through 15C and FIG. 16 are designated with like reference symbols.

As shown in FIG. 20B, the conductor 30 is connected to the surface of a semiconductor chip 22 on which the collector and the cathode are formed through a solder 84. Further, a conductor spacer 82 is connected to the surface of the semiconductor chip 22 on which the emitter and the anode are formed through a solder 80. The conductor 40 is connected to the conductive spacer 82 through a solder 86.

The gate and a Kelvin emitter electrode of the semiconductor chip 22 is connected to terminals 68 through bonding wires G, KE. The insulating film 66 and the snubber resistor 18s are disposed along the elongated portion of the conductor 40. The snubber resistor 18s is connected to the capacitor 16s through a bonding wire 90. The capacitor 16s is connected to the conductor 30 through a bonding wire 91.

(With Regard to the Switching Element Forming the Flowing Restriction Element)

The switching element is not limited to the IGBT, but may be any other elements, such as a power MOS type field effect transistor or a thyristor.

(With Regard to the Semiconductor Chip)

The semiconductor chip is not limited to the vertical device, but may be a horizontal device.

(With Regard to the Use of the Switching Element)

The use of the series connection unit including the pair of the switching elements connected in series is not limited to a power converting circuit disposed between the in-vehicle device and the high-voltage battery. For example, the series connection unit may be employed to form a power converting circuit for supplying the electric power from the high-voltage battery 12 to a compressor of a vehicle air conditioner. As another example, the series connection unit may be employed to form a DCDC converter that decreases the voltage of the high-voltage battery 12 and outputs the voltage to a low-voltage battery.

Further, in the boost converter CV of FIG. 1, the series connection unit may include the free wheel diode FDp without including the high-potential side switching element Swp, so as to form a boost chopper circuit. Specifically, the power module PM includes the low-potential side switching element Swp as the first flowing restriction element, the free wheel diode FDp connected in anti-parallel with the switching element Swp, and the series connection unit including the high-potential side free wheel diode FDp as the second flowing restriction element. However, the power module PM does not include the high-potential side switching element Swp.

The individual snubber circuit SCs can be added to such a structure. In such a case, for example, the individual snubber circuit SCs may be connected only to the second flowing restriction element in a parallel manner, in place of connecting the individual snubber circuit SCs to each of the first flowing restriction element and the second flowing restriction element in a parallel manner.

Further, it is not always necessary that the power module PM has the radiator 50 and/or the insulating film 50. Also in such a case, the advantageous effect (1) of the first embodiment can be still achieved.

Moreover, it is not always necessary that the power module PM has the radiator 56 and/or the insulating film 54. Also in such a case, the advantageous effect (1) of the first embodiment can be still achieved.

In an embodiment, a switching device includes a flowing restriction element, a conductor and a snubber resistor. The flowing restriction element has an opening and closing function to open and close a flowing path of an electric current. The conductor is connected to the flowing restriction element. The snubber resistor is connected to the flowing restriction element and constitutes a snubber circuit. The snubber resistor is disposed along the conductor.

In such a structure, since the snubber resistor is disposed along the conductor connected to the flowing restriction element, the advantageous effect (1) of the first embodiment can be achieved.

In an embodiment, the conductor provides a terminal of the switching device. In such a structure, the advantageous effect (2) of the first embodiment can be achieved.

In an embodiment, the flowing restriction element is a first flowing restriction element, and the switching device further includes a second flowing restriction element. The first flowing restriction element and the second flowing restriction element are connected in series and constitute a series connection unit. The second flowing restriction element includes at least one of a rectifying function to permit an electric current in one direction and an opening and closing function to open and close a flowing path of an electric current. The snubber circuit is connected in parallel with the series connection unit.

In an embodiment, the conductor connected to the first flowing restriction element is a first conductor, and the switching device further includes a second conductor. The first conductor and the second conductor are connected to ends of the series connection unit. The first conductor and the second conductor are aligned across a clearance. The first conductor has an elongated portion that is elongated toward the second conductor from a projection area defined by projecting the first flowing restriction element onto the first conductor. The snubber resistor connected to the first flowing restriction element is disposed along the elongated portion of the first conductor.

In such a structure, the surface area of the first conductor is increased by the elongated portion. Therefore, the heat radiation function of the first conductor for radiating heat from the first flowing restriction element improves. Further, since the snubber resistor is disposed along the elongated portion, the current path of the snubber circuit is shortened.

In an embodiment, the conductor connected to the first flowing restriction element is a first conductor, and the snubber resistor connected to the first flowing restriction element is a first snubber resistor. The switching device further includes a second conductor. The snubber circuit includes a second snubber resistor that is connected to the second flowing restriction element. The first conductor and the second conductor are connected to ends of the series connection unit. The first conductor and the second conductor are aligned across a clearance. The second conductor has an elongated portion that is elongated toward the first conductor from a projection area defined by projecting the second flowing restriction element onto the second conductor. The second snubber resistor is disposed along the elongated portion of the second conductor.

In such a structure, since the surface area of the second conductor is increased by the elongated portion. Therefore, the heat radiation function of the second conductor for radiating heat from the second flowing restriction element improves. Further, since the snubber resistor is disposed along the elongated portion, the current path of the snubber circuit is shortened.

In an embodiment, a switching device includes a first flowing restriction element, a second flowing restriction element, a first conductor, a second conductor, and a snubber circuit. The first flowing restriction element has a rectifying function to permit an electric current in one direction. The second flowing restriction element has at least one of an opening and closing function to open and close a flowing path of an electric current and a rectifying function to permit an electric current in one direction. The first flowing restriction element and the second flowing restriction element are connected in series to constitute a series connection unit. The first conductor is connected to the first flowing restriction element. The second conductor is connected to the second flowing restriction element. The snubber circuit includes a snubber resistor, and is connected in parallel with the series connection unit. The snubber resistor is disposed along the second conductor.

In such a structure, since the snubber resistor is disposed along the second conductor connected to the second flowing restriction element, the heat generated from the snubber resistor is radiated through the conductor.

In an embodiment, the first conductor and the second conductor are aligned across a clearance. The second conductor has an elongated portion elongated toward the first conductor from a projection area defined by projecting the second flowing restriction element onto the second conductor. The snubber resistor is disposed along the elongated portion.

In such a structure, since the second conductor has the elongated portion, the heat radiation function of the second conductor for radiating heat from the second flowing restriction element improves. Further, since the snubber resistor is disposed along the elongated portion, the current path of the snubber circuit is shortened.

In an embodiment, the second conductor provides a terminal of the switching device. In such a structure, the advantageous effect (2) of the first embodiment can be achieved.

In an embodiment, the first conductor is disposed to connect between the first flowing restriction element and the snubber circuit, and the second conductor is disposed to connect between the second flowing restriction element and the snubber circuit. The switching device further includes a third conductor that connects between the first flowing restriction element and the second flowing restriction element. The first flowing restriction element and the second flowing restriction element are embedded in the insulating member. The first conductor, the second conductor and the third conductor are disposed in contact with the insulating member.

In the switching device having the snubber circuit, a current path where the electric current suddenly changes in accordance with an opening and closing operation of the first flowing restriction element can be localized to a loop path provided by the first flowing restriction element, the second flowing restriction element and the snubber circuit. Since the loop path is formed in contact with the insulating member in which the first flowing restriction element and the second flowing restriction element are embedded, the current path is sufficiently shortened. Therefore, the parasitic inductance generating the surge and the radiation noise can be reduced.

In such a structure, the first flowing restriction element, the second flowing restriction element, the first conductor, the second conductor, the third conductor and the snubber circuit are integrated into a unit through the insulating member.

In an embodiment, the first flowing restriction element is formed in a first semiconductor chip, and the second flowing restriction element is formed in a second semiconductor chip. The first semiconductor chip and the second semiconductor chip are aligned to each other. The first conductor and the second conductor are disposed on a first side of the first semiconductor chip and the second semiconductor chip. The third conductor is disposed on a second side of the first semiconductor chip and the second semiconductor chip.

In such a structure, the change in electric current due to the opening and closing operation of the first flowing restriction element can be localized to an electric current path connecting between the first side and the second side of the first and second semiconductor chip.

In an embodiment, the first semiconductor chip and the second semiconductor chip are vertical devices, respectively. The first surface and a second surface of the first semiconductor chip provide ends of the flowing path of the electric current of the first flowing restriction element, and a first surface and a second surface of the second semiconductor chip provide ends of the flowing path of the electric current of the second flowing restriction element.

In an embodiment, the insulating member is provided by a multilayer board, and the first conductor, the second conductor and the third conductor include wirings of the multilayer board. In such a structure, the loop path provided by the first flowing restriction element, the second flowing restriction element and the snubber circuit can be shortened by the wirings of the multilayer board.

In an embodiment, side surfaces of the multilayer board can be covered with a molding member. In such a case, the rigidity and insulation property of the switching device improve.

In an embodiment, the insulating member is a molding member, and the first flowing restriction element and the second flowing restriction element are embedded in the molding member.

In an embodiment, the conductor is one of a pair of conductors connected to opposite ends of the flowing path of the electric current of the flowing restriction element. The one includes an elongated portion that is elongated from a projection area defined by projecting a corresponding end of the flowing path onto the one. The elongated portion of the one is connected to the other, and the snubber resistor is disposed along the elongated portion of the one.

In such a structure, since the one includes the elongated portion, the surface area of the one is increased. Therefore, the heat radiation function of the one for radiating heat from the flowing restriction element improves.

In an embodiment, the flowing restriction element is embedded in the insulating member, and the pair of conductors is disposed in contact with the insulting member. In such a case, the current path provided by the snubber circuit and the flowing restriction element can be sufficiently shortened.

Additional advantages and modifications will readily occur to those skilled in the art. The invention in its broader term is therefore not limited to the specific details, representative apparatus, and illustrative examples shown and described.

What is claimed is:

1. A switching device comprising:
a flowing restriction element that has an opening and closing function to open and close a flowing path of an electric current;
a conductor that is connected to the flowing restriction element; and
a snubber resistor that is connected to the flowing restriction element and constitutes a snubber circuit, wherein
the snubber resistor is disposed along the conductor, wherein:
the flowing restriction element is a first flowing restriction element;
the switching device further comprises a second flowing restriction element;

the second flowing restriction element and the first flowing restriction element are connected in series, and constitute a series connection unit;

the second flowing restriction element includes at least one of a rectifying to function to permit an electric current in one direction and an opening and closing function to open and close a flowing path of an electric current;

the snubber circuit is connected in parallel with the series connection unit;

the conductor is a first conductor connected to the first flowing restriction element;

the switching device further comprises a second conductor;

the first conductor and the second conductor are connected to ends of the series connection unit;

the first conductor and the second conductor are aligned across a clearance;

the first conductor has an elongated portion that is elongated toward the second conductor from a projection area defined by projecting the first flowing restriction element onto the first conductor; and the snubber resistor connected to the first flowing restriction element is disposed along the elongated portion of the first conductor.

2. The switching device according to claim 1, wherein the conductor provides a terminal of the switching device.

3. The switching device according to claim 1, wherein a thickness of the conductor is reduced at a portion where the snubber resistor is disposed smaller than a remaining portion thereof.

4. The switching device according to claim 1, wherein:
the conductor includes a first conductor portion and a second conductor portion, the first conductor portion being connected to the flowing restriction element;
the snubber resistor is disposed along the second conductor portion; and
the second conductor portion is bonded with the first conductor portion.

5. The switching device according to claim 1, wherein:
the snubber resistor is disposed along the conductor into layers and is in contact with the conductor; and
a thin film conductor is disposed along a surface of the snubber resistor opposite to the conductor, the thin film conductor having a resistivity smaller than that of the snubber resistor.

6. A switching device comprising;
a flowing restriction element that has an open and closing function to open and close a flowing path of an electric current:
a conductor that is connected to the flowing restriction element; and
a snubber resistor that is connected to the flowing restriction element and constitutes a snubber circuit, wherein:
the snubber resistor is disposed along the conductor;
the flowing restriction element is a first flowing restriction element;
the switching device further comprises a second flowing restriction element;
the second flowing restriction element and the first flowing restriction element are connected in series, and constitute a series connection unit;
the second flowing restriction element includes at least one of a rectifying function to permit an electric current in one direction and an opening and closing function to open and close flowing path of an electric current;
the snubber circuit is connected parallel with the series connection unit;

the conductor is a first conductor connected to the first flowing restriction element;

the snubber resistor is a first snubber resistor connected to the first flowing restriction element;

the switching device further comprises a second conductor;

the snubber circuit includes a second snubber resistor that is connected to the second flowing restriction element;

the first conductor and the second conductor are connected to ends of the series connection unit;

the first conductor and the second conductor are aligned across a clearance;

the second conductor has an elongated portion that is elongated toward the first conductor from a projection area defined by projecting the second flowing restriction element onto the second conductor; and the second snubber resistor is disposed along the elongated portion of the second conductor.

7. A switching device comprising:
a first flowing restriction element that has a rectifying function to permit an electric current in one direction;
a second flowing restriction element that has at least one of an opening and closing function to open and close a flowing path of an electric current and a rectifying function to permit an electric current in one direction, the first flowing restriction element and the second flowing restriction element being connected in series and constituting a series connection unit;
a first conductor that is connected to the first flowing restriction element;
a second conductor that is connected to the second flowing restriction element; and
a snubber circuit that includes a snubber resistor, and is connected in parallel with the series connection unit, wherein:
the snubber resistor is disposed along the second conductor;
the first conductor connects between first flowing restriction element and the snubber circuit;
the second conductor connects between the second flowing restriction element and the snubber circuit;
the switching device further comprises:
a third conductor that connects between the first flowing restriction element and the second flowing restriction element; and
an insulating member;
the first flowing restriction element and the second flowing restriction element are embedded in the insulating member; and
the first conductor. the second conductor and the third conductor are disposed in contact with the insulating member.

8. The switching device according to claim 7, wherein the second conductor provides a terminal of the switching device.

9. The switching device according to claim 7, wherein:
the first conductor and the second conductor are aligned across a clearance;
the second conductor has an elongated portion elongated toward the first conductor from a projection area defined by projecting the second flowing restriction element onto the second conductor; and
the snubber resistor is disposed along the elongated portion.

10. The switching device according to claim 7, wherein the first flowing restriction element, the second flowing restriction element, the first conductor, the second conductor, the third conductor and the snubber circuit are integrated into a unit through the insulating member.

11. The switching device according to claim 7, wherein:
the first flowing restriction element is formed in a first semiconductor chip;
the second flowing restriction element is formed in a second semiconductor chip;
the first semiconductor chip and the second semiconductor chip are aligned to each other;
the first conductor and the second conductor are disposed on a first side of the first semiconductor chip and the second semiconductor chip; and
the third conductor is disposed on a second side of the first semiconductor chip and the second semiconductor chip.

12. The switching device according to claim 11, wherein:
the first semiconductor chip and the second semiconductor chip are vertical devices, respectively;
a first surface and a second surface of the first semiconductor chip provide ends of the flowing path of the electric current of the first flowing restriction element; and
a first surface and a second surface of the second semiconductor chip provide ends of the flowing path of the electric current of the second flowing restriction element.

13. The switching device according to claim 7, wherein:
the insulating member is provided by a multilayer board; and
the first conductor, the second conductor and the third conductor include wirings of the multilayer board.

14. The switching device according to claim 13, further comprising:
a molding part molding side surfaces of the multilayer board.

15. The switching device according to claim 7, wherein the insulating member is a molding part molding the first flowing restriction element and the second flowing restriction element.

16. The switching device according to claim 7, wherein the snubber circuit includes a plurality of capacitors connected in parallel with each other.

17. A switching device comprising:
a flowing restriction element that has an opening and closing function to open and close a flowing path of an electric current;
a conductor that is connected to the flowing restriction element; and
a snubber resistor that is connected to the flowing restriction element and constitutes a snubber circuit, wherein:
the snubber resistor is disposed along the conductor;
the conductor is one of a pair of conductors connected to opposite ends of the flowing path of the electric current of the flowing restriction element;
the one includes an elongated portion that is elongated from a projection area defined by projecting a corresponding end of the flowing path onto the one;
the elongated portion of the one is connected to the other; and
the snubber resistor is disposed along the elongated portion of the one.

18. The switching device according to claim 17, wherein the flowing restriction element is provided by a semiconductor chip, and the semiconductor chip is a vertical device.

19. The switching device according to claim 17, further comprising:
an insulating member embedding the flowing restriction element therein, wherein
the pair of conductors is disposed in contact with the insulating member.

20. The switching device according to claim 19, wherein the pair of conductors, the flowing restriction element and the snubber circuit are integrated into a unit through the insulating member.

21. The switching device according to claim 19, wherein:
the insulating member is provided by a multilayer board; and
the pair of conductors includes wirings of the multilayer board.

22. The switching device according to claim 21, further comprising:
a molding member that molds side surfaces of the multilayer board.

23. The switching device according to claim 19, wherein the insulating member is provided by a molding member that molds the flowing restriction element therein.

24. A switching device comprising:
a flowing restriction element that has an opening and closing function to open and close a flowing path of an electric current;
a conductor that is connected to the flowing restriction element; and
a snubber res the flowing restriction element and constitutes a snubber circuit, wherein;
the snubber resistor is disposed along the conductor;
the switching device further comprises an insulating member disposed between the conductor and the snubber resistor;
the snubber resistor includes a first end connected to the conductor and a second end opposite to the first end;
the second end of the snubber resistor is connected to a wiring disposed within the insulating member through a via conductor; and
a surface of the via conductor opposed to the snubber resistor is fully covered with an electrode material having a resistivity smaller than that of the snubber resistor.

* * * * *